(12) United States Patent
Mayer et al.

(10) Patent No.: US 10,186,644 B2
(45) Date of Patent: Jan. 22, 2019

(54) SELF-ALIGNED FLOATING MIRROR FOR CONTACT VIAS

(71) Applicant: Cree, Inc., Durham, NC (US)

(72) Inventors: Eric Mayer, Raleigh, NC (US); Jae Park, Cary, NC (US); Manuel L. Breva, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/860,483

(22) Filed: Sep. 21, 2015

(65) Prior Publication Data

US 2016/0087173 A1 Mar. 24, 2016
US 2017/0179350 A9 Jun. 22, 2017

Related U.S. Application Data

(63) Continuation-in-part of application No. 14/699,302, filed on Apr. 29, 2015, which is a continuation-in-part
(Continued)

(51) Int. Cl.
*H01L 27/15* (2006.01)
*H01L 33/60* (2010.01)
(Continued)

(52) U.S. Cl.
CPC .......... *H01L 33/60* (2013.01); *H01L 25/0753* (2013.01); *H01L 27/15* (2013.01);
(Continued)

(58) Field of Classification Search
CPC ....... H01L 27/15; H01L 33/406; H01L 33/46; H01L 33/60; H01L 33/62
See application file for complete search history.

(56) References Cited

U.S. PATENT DOCUMENTS

| 1,393,573 A | 10/1921 | Ritter ............................. 362/509 |
| 1,880,399 A | 10/1932 | Benjamin ..................... 362/277 |

(Continued)

FOREIGN PATENT DOCUMENTS

| CH | 101449100 | 6/2009 |
| CN | 1841183 A | 10/2006 |

(Continued)

OTHER PUBLICATIONS

Office Action for U.S. Appl. No. 14/699,302; dated Jul. 28, 2016.
(Continued)

*Primary Examiner* — Joseph Galvin, III

(57) ABSTRACT

Described herein are LED chips incorporating self-aligned floating mirror layers that can be configured with contact vias. These mirror layers can be utilized to reduce dim areas seen around the contact vias due to underlying material layers without the need for the mirror layer to be designed at some tolerance distance from the electrical via. This increases mirror area, eliminating lower light reflection in the proximity of the via and producing higher light output with greater light emission uniformity. In some embodiments, the mirror layer is formed with a contact via. This allows for a self-aligning process and results in the mirror layer extending substantially from the edge of the via.

16 Claims, 14 Drawing Sheets

Related U.S. Application Data of application No. 14/050,001, filed on Oct. 9, 2013, which is a continuation-in-part of application No. 13/168,689, filed on Jun. 24, 2011, now Pat. No. 8,686,429.

(51) Int. Cl.

| | | |
|---|---|---|
| *H01L 33/62* | (2010.01) | |
| *H01L 25/075* | (2006.01) | |
| *H01L 33/40* | (2010.01) | |
| *H01L 33/46* | (2010.01) | |
| *H01L 33/08* | (2010.01) | |
| *H01L 33/38* | (2010.01) | |

(52) U.S. Cl.
CPC ............ *H01L 27/156* (2013.01); *H01L 33/08* (2013.01); *H01L 33/382* (2013.01); *H01L 33/405* (2013.01); *H01L 33/46* (2013.01); *H01L 33/62* (2013.01); *H01L 2224/32245* (2013.01); *H01L 2224/32257* (2013.01); *H01L 2224/48091* (2013.01); *H01L 2224/48247* (2013.01); *H01L 2224/73265* (2013.01); *H01L 2924/00014* (2013.01); *H01L 2924/181* (2013.01); *H01L 2933/0016* (2013.01); *H01L 2933/0025* (2013.01); *H01L 2933/0058* (2013.01); *H01L 2933/0066* (2013.01)

(56) References Cited

U.S. PATENT DOCUMENTS

| | | | |
|---|---|---|---|
| 2,214,600 A | 9/1940 | Winkler ........................ 362/279 |
| 2,961,927 A | 4/1961 | Orsatti et al. |
| 2,981,827 A | 4/1961 | Orsatta ........................... 362/84 |
| 3,395,272 A | 7/1968 | Nicholl ......................... 362/305 |
| 4,420,800 A | 12/1983 | Van Horn .................... 362/297 |
| 4,946,547 A | 8/1990 | Palmour et al. |
| 5,018,157 A | 5/1991 | Deppe et al. ............ 372/45.013 |
| 5,200,022 A | 4/1993 | Kong et al. |
| RE34,861 E | 2/1995 | Davis et al. |
| 5,768,339 A | 6/1998 | O'Hara ........................ 378/147 |
| 5,912,915 A | 6/1999 | Reed et al. ..................... 372/93 |
| 6,055,261 A | 4/2000 | Reed et al. |
| 6,076,948 A | 6/2000 | Bukosky et al. |
| 6,111,276 A | 8/2000 | Mauk .............................. 257/98 |
| 6,149,283 A | 11/2000 | Conway et al. |
| 6,409,361 B1 | 6/2002 | Ikeda ........................... 362/240 |
| 6,454,439 B1 | 9/2002 | Camarota ..................... 362/293 |
| 6,459,713 B2 | 10/2002 | Jewell ............................ 372/46 |
| 6,558,032 B2 | 5/2003 | Kondo et al. ................ 362/516 |
| 6,585,397 B1 | 7/2003 | Ebiko .......................... 362/297 |
| 6,603,151 B2 | 8/2003 | Lin et al. ....................... 257/98 |
| 6,643,305 B2 | 11/2003 | Bewley et al. ............ 372/45.01 |
| 6,657,236 B1 | 12/2003 | Thibeault et al. .............. 257/98 |
| 6,758,582 B1 | 7/2004 | Hsiao et al. |
| 6,784,462 B2 | 8/2004 | Schubert ........................ 257/98 |
| 6,793,373 B2 | 9/2004 | Matsuba et al. ............. 362/260 |
| 6,797,987 B2 | 9/2004 | Chen ............................. 257/98 |
| 6,812,502 B1 | 11/2004 | Chien et al. ................... 257/99 |
| 6,817,737 B2 | 11/2004 | Romano et al. ............. 362/293 |
| 6,840,652 B1 | 1/2005 | Hymer |
| 6,851,834 B2 | 2/2005 | Leysath ....................... 362/303 |
| 6,986,594 B2 | 1/2006 | Wirth et al. |
| 6,995,402 B2 | 2/2006 | Ludowise et al. ............. 257/91 |
| 7,121,690 B1 | 10/2006 | Ramer et al. ................. 362/297 |
| 7,213,940 B1 | 5/2007 | Van de Ven et al. ........ 362/231 |
| 7,221,044 B2 | 5/2007 | Fan et al. .................... 257/676 |
| 7,321,126 B2 | 1/2008 | Singer et al. ................. 250/492 |
| 7,332,365 B2 | 2/2008 | Nakamura et al. |
| 7,339,965 B2 | 3/2008 | Ledentsov et al. ............ 372/45 |
| 7,573,074 B2 | 8/2009 | Shum et al. .................... 257/99 |
| 7,607,808 B2 | 10/2009 | Birman et al. ............... 362/489 |
| 7,622,746 B1 | 11/2009 | Lester et al. ................... 257/98 |
| 7,638,810 B2 | 12/2009 | Bour et al. ..................... 257/98 |
| 7,784,977 B2 | 8/2010 | Moolman et al. ............ 362/298 |
| 7,795,623 B2 | 9/2010 | Emerson et al. ............... 257/79 |
| 7,821,023 B2 | 10/2010 | Yuan et al. ..................... 257/93 |
| 7,915,629 B2 | 3/2011 | Ibbetson et al. ................ 257/98 |
| 7,985,970 B2 | 7/2011 | Ibbetson et al. |
| 8,118,451 B2 | 2/2012 | Householder et al. ....... 362/277 |
| 8,212,273 B2 | 7/2012 | McKenzie et al. |
| 8,235,541 B2 | 8/2012 | Chen ............................. 362/97 |
| 8,324,652 B1 | 12/2012 | Lester et al. |
| 8,368,100 B2 | 2/2013 | Donofrio |
| 8,431,423 B2 | 4/2013 | Basin et al. .................... 438/26 |
| 8,492,785 B2 | 7/2013 | Hodota .......................... 257/98 |
| 8,791,471 B2 | 7/2014 | Leung ............................ 257/88 |
| 2003/0025212 A1 | 2/2003 | Bhat et al. |
| 2003/0210550 A1 | 11/2003 | Matsuba et al. |
| 2004/0085463 A1 | 5/2004 | Sharma |
| 2004/0155565 A1 | 8/2004 | Holder et al. |
| 2004/0217362 A1 | 11/2004 | Slater et al. |
| 2005/0063061 A1 | 3/2005 | Grawert et al. .............. 359/586 |
| 2005/0168994 A1 | 8/2005 | Jacobson et al. ............ 362/311 |
| 2005/0211993 A1 | 9/2005 | Sano et al. ..................... 257/79 |
| 2005/0225222 A1 | 10/2005 | Mazzochette et al. ......... 313/46 |
| 2005/0242358 A1 | 11/2005 | Tu et al. ......................... 257/98 |
| 2006/0039009 A1 | 2/2006 | Kiesel et al. ................. 356/519 |
| 2006/0049411 A1 | 3/2006 | Nakamura et al. |
| 2006/0060874 A1 | 3/2006 | Edmond et al. ................ 257/98 |
| 2006/0076568 A1 | 4/2006 | Keller et al. ................... 257/98 |
| 2006/0163586 A1 | 7/2006 | Denbaars et al. |
| 2006/0163589 A1 | 7/2006 | Fan et al. ....................... 257/88 |
| 2006/0273335 A1 | 12/2006 | Asahara et al. |
| 2006/0274805 A1 | 12/2006 | Song et al. |
| 2006/0278885 A1 | 12/2006 | Tain et al. |
| 2007/0057270 A1 | 3/2007 | Bour et al. ..................... 257/99 |
| 2007/0057273 A1 | 3/2007 | Yoo ................................ 257/99 |
| 2007/0139923 A1 | 6/2007 | Negley |
| 2007/0145380 A1 | 6/2007 | Shum et al. |
| 2007/0158668 A1 | 7/2007 | Tarsa et al. ..................... 257/79 |
| 2007/0217193 A1 | 9/2007 | Lin |
| 2007/0217200 A1 | 9/2007 | Yang et al. ................... 362/277 |
| 2007/0236626 A1* | 10/2007 | Koganezawa ....... G02B 6/0083 349/61 |
| 2008/0035949 A1 | 2/2008 | Fudeta et al. ................... 257/99 |
| 2008/0061304 A1 | 3/2008 | Huang et al. |
| 2008/0123341 A1 | 5/2008 | Chiu ............................ 362/294 |
| 2008/0144688 A1 | 6/2008 | Chua et al. |
| 2008/0173884 A1 | 7/2008 | Chitnis et al. .................. 438/22 |
| 2008/0179611 A1 | 7/2008 | Chitnis et al. .................. 257/98 |
| 2008/0185609 A1 | 8/2008 | Kozawa et al. ................. 257/99 |
| 2008/0191233 A1 | 8/2008 | Yang et al. |
| 2008/0265268 A1 | 10/2008 | Braune et al. .................. 257/98 |
| 2008/0272391 A1 | 11/2008 | Kapur et al. |
| 2008/0310158 A1 | 12/2008 | Harbers et al. .............. 362/294 |
| 2009/0026478 A1 | 1/2009 | Yoon et al. ..................... 257/98 |
| 2009/0029495 A1 | 1/2009 | Li et al. .......................... 438/29 |
| 2009/0039371 A1 | 2/2009 | Kim |
| 2009/0050908 A1 | 2/2009 | Yuan et al. ..................... 257/88 |
| 2009/0103293 A1 | 4/2009 | Harbers et al. .............. 362/231 |
| 2009/0121241 A1 | 5/2009 | Keller et al. ................... 257/94 |
| 2009/0152583 A1 | 6/2009 | Chen et al. ..................... 257/98 |
| 2009/0161356 A1 | 6/2009 | Negley et al. ............... 362/231 |
| 2009/0161367 A1* | 6/2009 | Vanden Eynden ....... F21V 7/10 362/297 |
| 2009/0213591 A1 | 8/2009 | Katabe et al. ................ 362/236 |
| 2009/0231856 A1 | 9/2009 | Householder |
| 2009/0283779 A1 | 11/2009 | Negley et al. ................. 257/88 |
| 2009/0283787 A1 | 11/2009 | Donofrio et al. ............... 257/98 |
| 2009/0323334 A1 | 12/2009 | Roberts et al. .............. 362/247 |
| 2010/0001299 A1 | 1/2010 | Chang et al. ................... 257/89 |
| 2010/0012962 A1 | 1/2010 | Hong et al. |
| 2010/0029023 A1 | 2/2010 | Neff et al. ....................... 438/15 |
| 2010/0033655 A1 | 2/2010 | Nakamoto |
| 2010/0038659 A1 | 2/2010 | Chen et al. |
| 2010/0039822 A1 | 2/2010 | Bailey ......................... 362/296 |
| 2010/0051995 A1 | 3/2010 | Katsuno et al. |
| 2010/0059785 A1 | 3/2010 | Lin et al. |
| 2010/0065881 A1 | 3/2010 | Kim |
| 2010/0078656 A1* | 4/2010 | Seo ......................... H01L 27/156 257/88 |
| 2010/0103678 A1 | 4/2010 | Van de Ven et al. ......... 362/294 |

(56) References Cited

U.S. PATENT DOCUMENTS

| | | | |
|---|---|---|---|
| 2010/0117099 A1 | 5/2010 | Leung | 257/88 |
| 2010/0117111 A1 | 5/2010 | Illek et al. | 257/98 |
| 2010/0140635 A1 | 6/2010 | Ibbetson et al. | |
| 2010/0140636 A1 | 6/2010 | Donofrio et al. | 257/98 |
| 2010/0151604 A1* | 6/2010 | Kal | H01L 27/153 438/29 |
| 2010/0155746 A1 | 6/2010 | Ibbetson et al. | 257/88 |
| 2010/0158437 A1 | 6/2010 | Decorby | 385/14 |
| 2010/0163887 A1 | 7/2010 | Kim | 257/76 |
| 2010/0163900 A1* | 7/2010 | Seo | H01L 33/007 257/98 |
| 2010/0165633 A1 | 7/2010 | Moolman et al. | 362/398 |
| 2010/0170035 A1 | 7/2010 | Kik | |
| 2010/0171094 A1 | 7/2010 | Lu et al. | 257/13 |
| 2010/0171135 A1 | 7/2010 | Engl et al. | |
| 2010/0252840 A1 | 10/2010 | Ibbetson et al. | |
| 2010/0279737 A1 | 11/2010 | Neff et al. | 438/14 |
| 2010/0308354 A1 | 12/2010 | David et al. | 257/98 |
| 2010/0327295 A1 | 12/2010 | Peng et al. | 257/88 |
| 2011/0001148 A1 | 1/2011 | Sun et al. | 257/88 |
| 2011/0001412 A1 | 1/2011 | Aanegola et al. | 313/501 |
| 2011/0001422 A1 | 1/2011 | Aanegola et al. | 313/501 |
| 2011/0025190 A1 | 2/2011 | Jagt | 313/112 |
| 2011/0044027 A1 | 2/2011 | Chen | 362/97 |
| 2011/0049546 A1 | 3/2011 | Heikman et al. | 257/98 |
| 2011/0075423 A1 | 3/2011 | Van De Ven | |
| 2011/0084294 A1 | 4/2011 | Yao | 257/93 |
| 2011/0156064 A1* | 6/2011 | Seo | H01L 25/0753 257/88 |
| 2011/0182073 A1 | 7/2011 | Sanpei et al. | 362/294 |
| 2011/0266568 A1 | 11/2011 | Aldaz et al. | |
| 2012/0025244 A1 | 2/2012 | Suh | 257/98 |
| 2012/0074441 A1* | 3/2012 | Seo | H01L 27/153 257/91 |
| 2012/0086026 A1 | 4/2012 | Engl | |
| 2012/0280263 A1 | 11/2012 | Ibbetson et al. | |
| 2014/0167065 A1 | 6/2014 | Bergman et al. | |
| 2014/0217439 A1 | 8/2014 | Jeon | |
| 2014/0312373 A1 | 10/2014 | Donofrio et al. | |
| 2015/0200230 A1 | 7/2015 | Jang et al. | |

FOREIGN PATENT DOCUMENTS

| | | |
|---|---|---|
| CN | 1957481 | 5/2007 |
| CN | 101103467 | 1/2008 |
| CN | 201007449 | 1/2008 |
| CN | 101460779 | 6/2009 |
| CN | 101460779 A | 6/2009 |
| DE | 10 2004 040 277 | 2/2006 |
| DE | 102007003282 | 7/2008 |
| DE | 102008005497 | 7/2009 |
| DE | 10 2008 035 900 | 11/2009 |
| EP | 1750310 A2 | 2/2007 |
| EP | 2259345 A1 | 12/2010 |
| EP | 236950 A2 | 9/2011 |
| JP | 06045649 | 2/1994 |
| JP | 06268252 | 9/1994 |
| JP | 2005197289 | 7/2005 |
| JP | 2010-87282 A | 4/2010 |
| KR | 100843426 B1 | 7/2008 |
| TW | 595689 | 5/2003 |
| TW | 595689 | 6/2004 |
| TW | M281297 | 11/2005 |
| TW | 200805717 | 1/2008 |
| TW | 200834991 | 8/2008 |
| WO | WO 2000/034709 A1 | 6/2000 |
| WO | WO 2005/066539 A1 | 7/2005 |
| WO | WO 2005/078338 A1 | 8/2005 |
| WO | WO 2005078338 | 8/2005 |
| WO | WO 2005117152 | 12/2005 |
| WO | WO 2006/092697 A1 | 9/2006 |
| WO | WO 2007121739 | 1/2007 |
| WO | WO 2007115040 | 10/2007 |
| WO | WO 2007115040 A2 | 10/2007 |
| WO | WO 2007/130536 A2 | 11/2007 |
| WO | WO 2007121739 A2 | 11/2007 |
| WO | WO 2008089324 A2 | 7/2008 |
| WO | WO 2008089324 A3 | 7/2008 |
| WO | WO 2008107654 | 9/2008 |
| WO | WO 2008149250 | 12/2008 |
| WO | WO 2009/056927 A1 | 5/2009 |
| WO | WO 2010/029475 A1 | 3/2010 |
| WO | WO 2010029475 | 3/2010 |
| WO | WO 2010029475 A1 | 3/2010 |
| WO | WO 2010151600 | 12/2010 |
| WO | WO 2011031098 A2 | 3/2011 |
| WO | WO 2011071100 A1 | 6/2011 |

OTHER PUBLICATIONS

Foreign Office Action for European Application No. 09836676.8; dated Jul. 21, 2016.

Certificate of Invention from Chinese Patent appl. No. 200980149205.2. dated Dec. 16. 2015.

Notice of Allowance from Chinese Patent Appl. No. 200980149203.4, dated Dec. 4. 2015.

Notification of Reexamination from Chinese Patent appl. No. 201080023107.8, dated Dec. 2, 2015.

Office Action from Chinese Patent appl. No. 201180047069.4, dated Dec. 24, 2015.

Examination Report from European Patent Appl. No. 10 774 320.5, dated Jan. 8. 2016.

First Office Action from Chinese Patent Appl. No. 2012800412299, dated Dec. 16. 2015.

Comments on the Written Opinion and Amendment from European Patent Appl. No. 14733925.3, dated Jan. 14, 2016.

Examination from European Patent Appl. No. 10 725 524.2-1757, dated Feb. 3. 2016.

Office Action and Search Report from Taiwanese Patent Appl. No. 10421191660, dated Sep. 2. 2015.

Notice of Issuance from Chinese Patent Application No. 200981149205.3. dated Sep. 24, 2015.

Office Action from U.S. Appl. No. 14/699,302; dated Apr. 5, 2016.

Office Action for Korean Application No. 10-2011-7015872; dated May 26, 2016.

Notice of Allowance for Application No. 099121883; dated Jun. 2, 2016.

Office Action from U.S. Appl. No. 14/050,001; dated Jun. 23, 2016.

Office Action from U.S. Appl. No. 14/219,916, dated Jun. 17, 2015.

Margalit et al. "64o C Continuous-Wave Operation of 1.5-um Vertical Cavity Laser", 1997, IEEE Journal od Selected Topics in Quantum Electronics, vol. 3, pp. 359-365.

Office Action from U.S. Appl. No. 14/185,589, dated Jul. 28, 2015.

Office Action from U.S. Appl. No. 14/050,001, dated Jul. 30, 2015.

Examination Report from European Appl. No. 10 725 524.2-1757, dated Jun. 19, 2015.

Third Office Action from Chinese Appl. No. 2011800470694, dated Apr. 29, 2015.

Third Office Action from Chinese Appl. No. 200980149203.4, dated Jul. 3, 2015.

Notice of Allowance from Taiwanese Patent Appl. No. 099110005, dated Jul. 20, 2015.

U.S. Appl. No. 13/168,689, filed Jun. 24, 2011, Bergman et al.

U.S. Appl. No. 14/602,040, filed Jan. 21, 2015, Donofrio et al.

U.S. Appl. No. 13/868,361, filed Apr. 23, 2013, Donofrio et al.

Office Action from U.S. Appl. No. 13/909,927, dated Apr. 23, 2015.

Office Action from U.S. Appl. No. 12/553,025, dated May 29, 2015.

Office Action from Taiwanese Patent Appl. No. 099110005, dated Mar. 23, 2015.

Office Action from Chinese Patent Appl. No. 200980149205.3, dated Mar. 11, 2015.

Rejection Decision Chinese Patent Appl. No. 201080023107.8, dated Mar. 19, 2015.

Office Action from Taiwanese Patent Appl. No. 099110005, dated Mar. 26, 2015.

Second Office Action from Chinese Patent Appl. No. 2009801492034, dated Jan. 6, 2015.

(56) References Cited

OTHER PUBLICATIONS

Office Action and Search Report from Taiwanese Patent Appl. No. 10420278720, dated Mar. 9, 2015.
Office Action from U.S. Appl. No. 12/553,025, dated Jan. 13, 2015.
Sanchez et al. Ion and electron beam assisted growth of nanometric SimOn structures for near field microscopy. Review of Scientific Instruments. vol. 73, #11, 2002, pp. 3901-3907.
Office Action from U.S. Appl. No. 14/185,589, dated Feb. 19, 2015.
Office Action from U.S. Appl. No. 12/606,377, dated Mar. 2, 2015.
Office Action from U.S. Appl. No. 14/219,916, dated Mar. 6, 2015.
Su, et al., "Nitride-Based LED's with n-GaN Current Spreading Layers", 2005, IEEE Electron Devices Letters, vol. 26, No, 12, pp 891-893; Dec. 2005.
Examiner's Report from European Patent Appl. No. 10 774 320.5-1757, dated Feb. 10, 2015.
European Examination Report from European Patent Appl. No. 10 725 524.2-1757, dated Nov. 3, 2014.
Search Report from Taiwanese Appl. No. 099121883, dated Oct. 2, 2014.
Huang, et al., "High-Performance GaN-Based Vertical-Injection Light-Emitting Diodes With TiO2-SiO2 Omnidriectional Reflector and n-GaN Roughness", IEEE Photonics Technology Letters, vol. 19, No. 8, Apr. 15, 2007.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13/028,946, filed Dec. 15, 2014.
Office Action from U.S. Appl. No. 14/219,916, dated Oct. 29, 2014.
Office Action from U.S. Appl. No. 13/909,927, dated Nov. 6, 2014.
Third Office Action from Chinese Appl. No. 201080023107.8, dated Sep. 29, 2014.
Communication from European Appl. No. 13709035.3-1551, dated Oct. 15, 2014.
Office Action from U.S. Appl. No. 12/606,377, dated Sep. 3, 2014.
Response to OA from U.S. Appl. No. 12/606,377, filed Oct. 23, 2014.
Office Action from U.S. Appl. No. 13/370,696, dated Aug. 27, 2014.
Examination Report from European Patent Appl. No. 10774320.5-1757, dated Sep. 5, 2014.
Second Office Action from Chinese Patent Appl. No. 2011800470694, dated Aug. 6, 2014.
International Preliminary Report on Patentability from Appl. No. PCT/US2013/028684, dated Sep. 18, 2014.
First Office Action and Search Report from Chinese Patent Appl. No. 2009-801492053, dated Jun. 20, 2014.
Office Action from U.S. Appl. No. 12/757,179, dated Jul. 15, 2014.
Office Action from U.S. Appl. No. 13/909,927, dated Aug. 8, 2014.
First Office Action from Chinese Patent Application No. 2009-801492034, dated Jun. 24, 2014.
Second OA from Chinese Patent Appl. No. 201080023107.8, dated Mar. 7, 2014.
Office Action from U.S. Appl. No. 12/757,179, dated Mar. 11, 2014.
Office Action from U.S. Appl. No. 13/909,927, dated Apr. 2, 2014.
Office Action from U.S. Appl. No. 12/606,377, dated Apr. 9, 2014.
International Search Report and Written Opinion for PCT Application No. PCT/US2011/001394 dated Nov. 3, 2011.
International Preliminary Report on Patentability from Application No. PCT/US09/66938, dated Apr. 3, 2012.
Dom LED Downlighting, Lithonia Lighting: an Acuity Brands, Company, www.lithonia.com, © 2009.
Ecos, Lighting the Next Generation, gothan: a division of Acuity Brands Lighting Inc., © 2008.
Renaissance Lighting brochure, © 2010.
Office Action from U.S. Appl. No. 12/855,500, dated May 31, 2013.
Response to OA from U.S. Appl. No. 12/855,500, filed Sep. 3, 2013.
Office Action from U.S. Appl. No. 13/071,349, dated May 28, 2013.
Response to OA from U.S. Appl. No. 13/071,349, filed Jul. 18, 2013.
Office Action from U.S. Appl. No. 13/071,349, dated Jan. 17, 2013.
Response to OA from U.S. Appl. No. 13/071,349, filed Apr. 10, 2013.
Office Action from U.S. Appl. No. 12/553,025, dated Jun. 19, 2013.
Huang et al. High-Performance GaN-Based Vertical-Injection Light-Emitting Diodes with TiO2-Sio2 Ohnidriectional Reflector and n-GaN Roughness. IEEE Photonics Technology Letters, vol. 19, No. 8, Apr. 15, 2007, pp. 565-567.
Raoufi et al. Surface characterization and microstructure of ITO thin films at different annealing temperatures. Applied Surface Science 253 (2007), pp. 9085-9090.
Office Action from U.S. Appl. No. 13/168,689, dated Jun. 28, 2013.
Office Action from U.S. Appl. No. 12/606,377, dated Nov. 26, 2012.
Response to OA from U.S. Appl. No. 12/606,377, filed Feb. 22, 2013.
Office from Patent U.S. Appl. No. 12/757,179, dated Dec. 31, 2012.
Response to OA from U.S. Appl. No. 12/757,179, filed Apr. 23, 2013.
Office Action from U.S. Appl. No. 13/415,626, dated Feb. 28, 2013.
Response to OA from U.S. Appl. No. 13/415,626, filed Apr. 17, 2013.
"Handbook of Optical Constants of Solids", edited by E. Palik, Academic Press, $1^{st}$ edition, Nov. 11, 1997.
International Search Report and Written Opinion from PCT Application No. PCT/US2013/028684, dated May 28, 2013.
Jong Kyu kim, et al., "GaInN Light-emitting Diodes with RuO2/SiO2/Ag Omni-directional Reflector", Applied Physics Letters, AIP, American Institute of Physics, Nelville, NY, US, vol. 84, No. 22, May 31, 2004, pp. 4508-4510, XP012061652.
Y.S. Zhao, et al., "Efficiency Enhancement of InGaN/GaN Light-Emitting Diodes with a Back-Surface distributed Bragg Reflector", Journal of Electronic Materials, vol. 32, No. 12, Dec. 1, 2003, pp. 1523-1526, XF055063308.
Xu Qing-tao et al., "Enhancing Extraction Efficiency from GaN-based LED by Using an Omni-directional Reflector and Photonic Crystal", Optoelectronics Letters, vol. 5, No. 6, Nov. 1, 2009, pp. 405-408, XP055063309.
J.-Q Xi, et al., "Optical Thin-film Materials with Low Refractive Index for Broadband Elimination of Fresnel Reflection", Nature Photonics, Nature Publishing Group, UK, vol. 1, No. 3, Mar. 1, 2007, pp. 176-179, XP002590687.
International Search Report and Written Opinion for Application No. PCT/US2012/034564, dated Sep. 5, 2012.
First Office Action from Japanese Patent Appl. No. 201180047069.4, dated: Dec. 18, 2013.
Search Report from Japanese Patent Appl. No. 201180047069.4, dated: Dec. 18, 2013.
Comments on the Written Opinion and Amendment of the Application from European Patent Appl. No. 12723543.0, dated Feb. 21, 2014.
Notice of Reasons for Rejection from Japanese Patent Appl. No. 2011-539526, dated Jun. 25, 2013 First Office Action and Search Report from Chinese Patent Appl. No. 201080023107.8, dated Jul. 12, 2013.
Office Action from U.S. Appl. No. 12/855,500, dated Dec. 4, 2013.
Decision of Patent Grant from Japanese Patent Appl. No. 2011-539526, dated Oct. 22, 2013.
Windisch et al. "Impact of Texture-Enhanced Transmission on High-Efficiency Surface-Textured Light-Emitting Diodes," Applied Physics Letters, vol. 79, No. 15, Oct. 2001, pp. 2315-2317.
Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.
Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.
Streubel, et al, "High Brightness AlGaInP Light-Emitting Diodes," IEEE Journal on Selected Topics in Quantum Electronics, vol. 8, No. 2, Mar./Apr. 2002, pp. 321-332.
Cree EZ400 LED Data Sheet, 2007 Cree's EZBright, LEDs.
Cree EZ700 LED Data Sheet, 2007 Cree's EZBright LEDs.
Cree EZ1000 LED Data Sheet, 2007 Cree's EZBright LEDs.
Cree EZBright290 LED Data Sheet, 2007 Cree's EZBright LEDs.

(56) References Cited

OTHER PUBLICATIONS

International Search Report and Written Opinion for counterpart Application No. PCT/US2009/066938 dated Aug. 30, 2010.
International Search Report and Written Opinion for PCT Application No. PCT/US2010/002827 dated May 2, 2011 (1).
Office Action from U.S. Appl. No. 12/418,796, dated: Jul. 20, 2011.
Office Action from U.S. Appl. No. 12/329,722, dated: Oct. 27, 2010.
Final Office Action from U.S. Appl. No. 12/553,025, dated Dec. 31, 2013.
Lin, et al., "Enhancement of InGaN-CaN Indium-Tin-Oxide Flip-Chip Light-Emitting Diodes with TiO2-SiO2 Multilayer Stack Omnidirectional Reflector", IEEE Photonics Technology Letters, vol. 18, No. 19, Oct. 1, 2006.
T-Clad Thermal Substrates Overview from the Berquist Company; www.begquestcompany.com.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 12/463,709, filed May 11, 2009, Donofrio, et al.
Notice of Allowance for Korean Application No. 10-2011-7015872; dated Sep. 29, 2016.
Office Action for Taiwan Application No. 099136758; dated Oct. 12, 2016.
Notice of Allowance for European Application No. 10774320.5; dated Oct. 27, 2016.
Office Action for U.S. Appl. No. 14/050,001; dated Dec. 21, 2016.
Examination from European Patent Appl. No. 09836676.8, dated Oct. 26. 2015.
Office Action Summary from Korean Patent Appl. No. 10-2011-7015872, dated Nov. 6, 2015.
Office Action from Taiwanese Patent Appl. No. 099136758, dated Oct. 26. 2015.
Office Action from U.S. Appl. No. 12/606,377, dated Sep. 18, 2015.
Office Action from U.S. Appl. No. 12/553,025, dated Nov. 10, 2015.
Chinese Grant Decision for Application No. 201080023107.8; Dated Jan. 12, 2017.
Foreign Office Action for European Application No. 10725524.2; dated Jan. 19, 2017.
Foreign Office Action for European Application No. 9801584.5; dated Feb. 9, 2017.
Office Action for U.S. Appl. No. 14/602,040; dated Mar. 2, 2017.
Foreign Office Action for Chinese Application No. 201180047069.4; dated Mar. 2, 2017.
Chinese Notification of Reexamination for Application No. 2011800470694; dated Jan. 3, 2018.
Chinese Office Action for Application No. 2014800322484 ; dated Jun. 2, 2017.
Office Action for U.S. Appl. No. 14/699,302; dated Jun. 16, 2017.
Office Action for U.S. Appl. No. 14/602,040; dated Oct. 4, 2017.
Office Action for U.S. Appl. No. 14/699,302; dated Nov. 2, 2017.
Office Action for U.S. Appl. No. 14/699,302; dated May 31, 2018.
Office Action from U.S. Appl. No. 14/050,001: dated Jan. 29, 2016.

\* cited by examiner

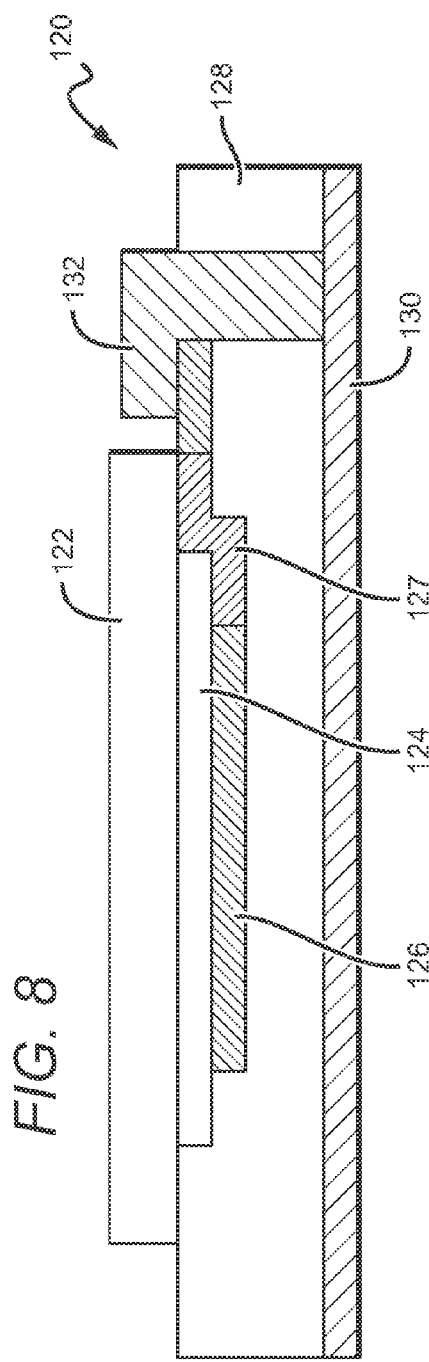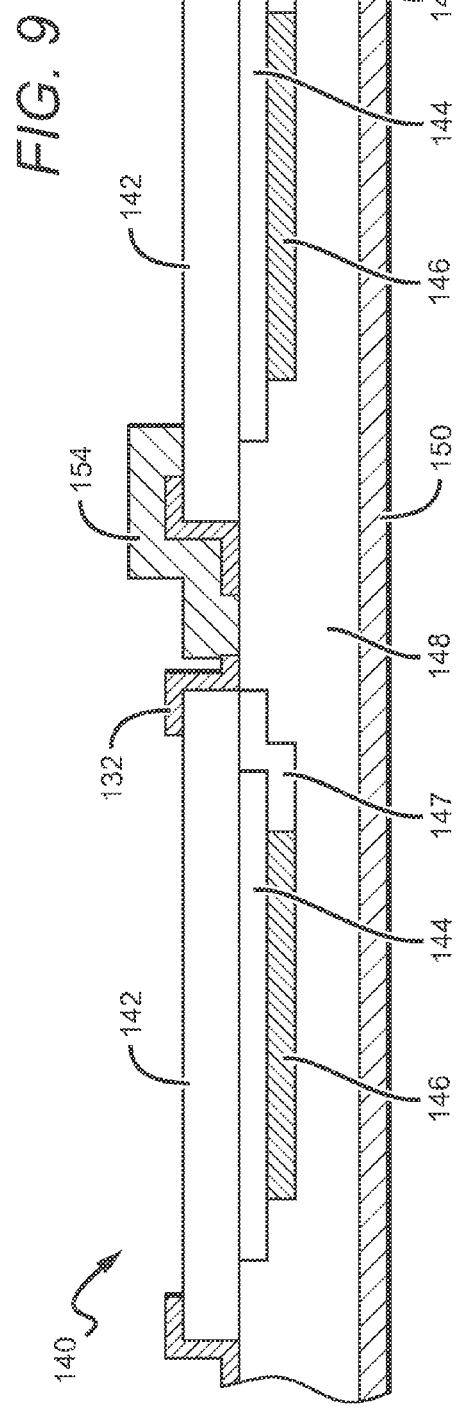

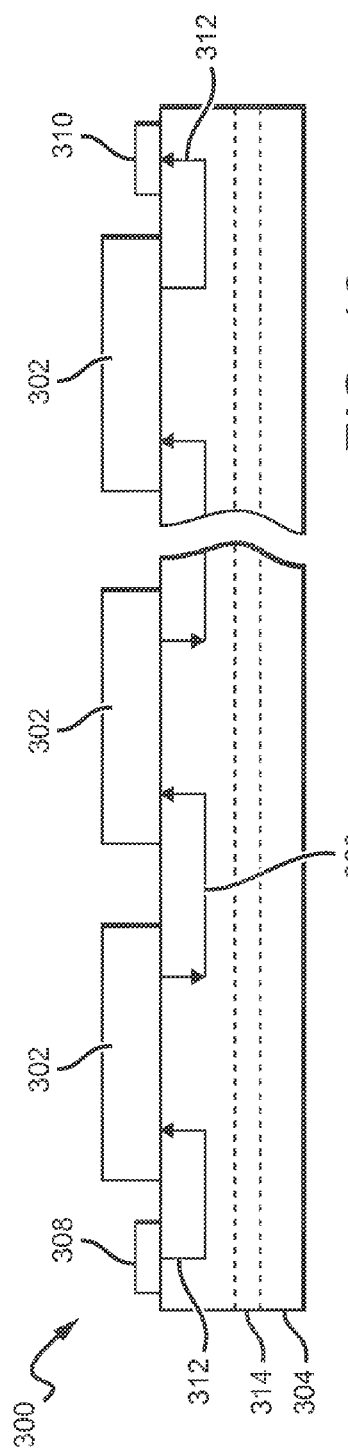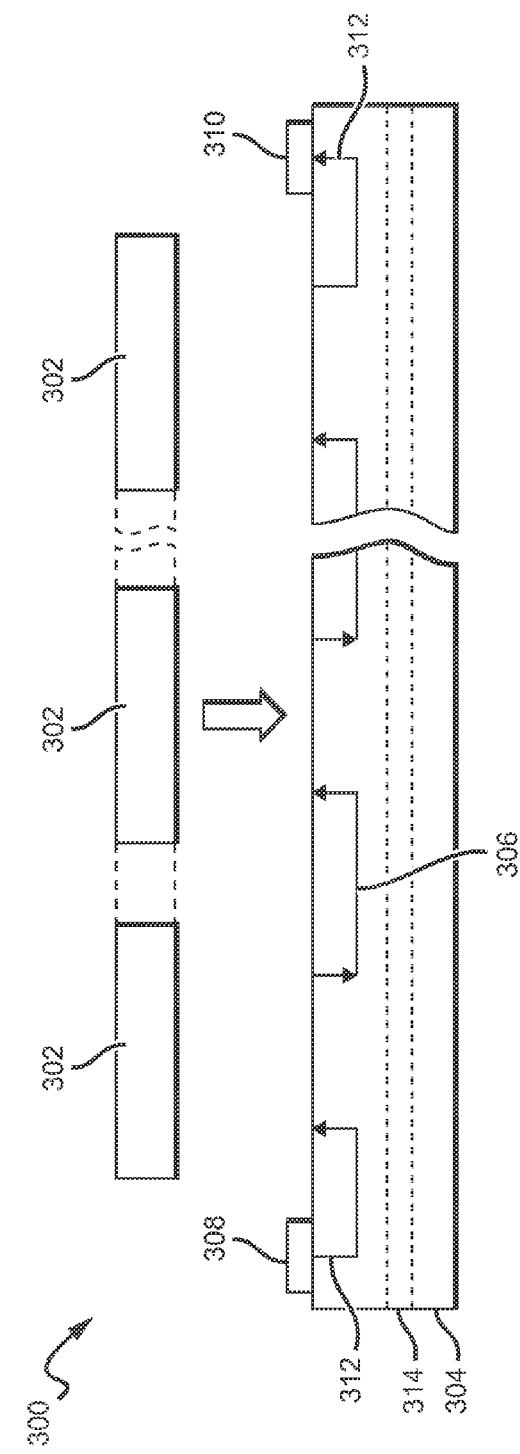

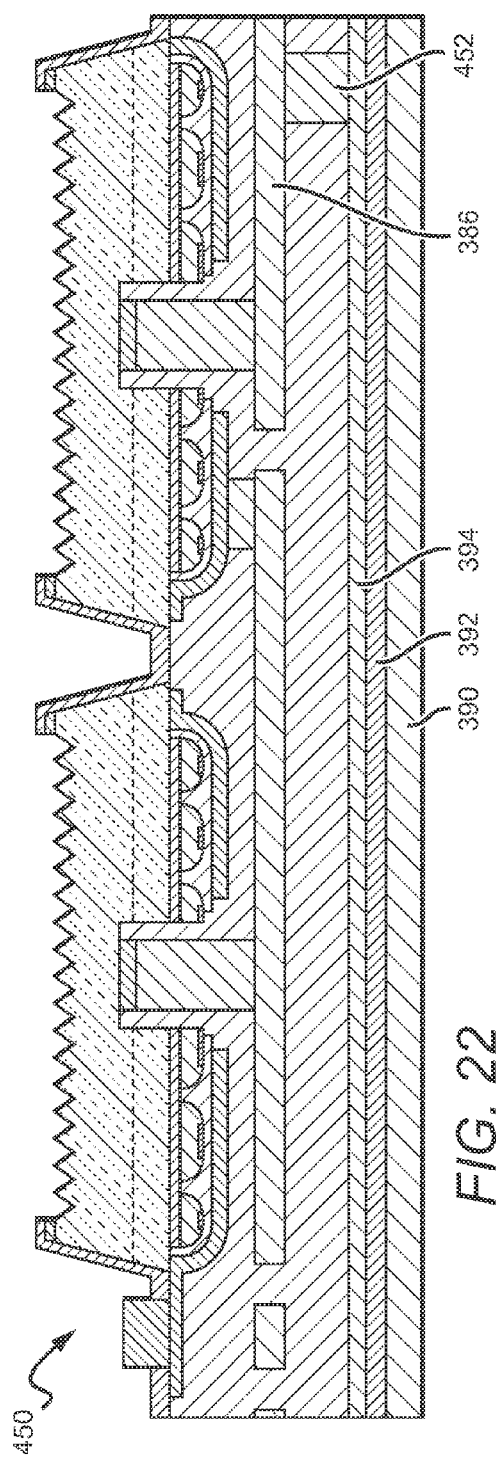
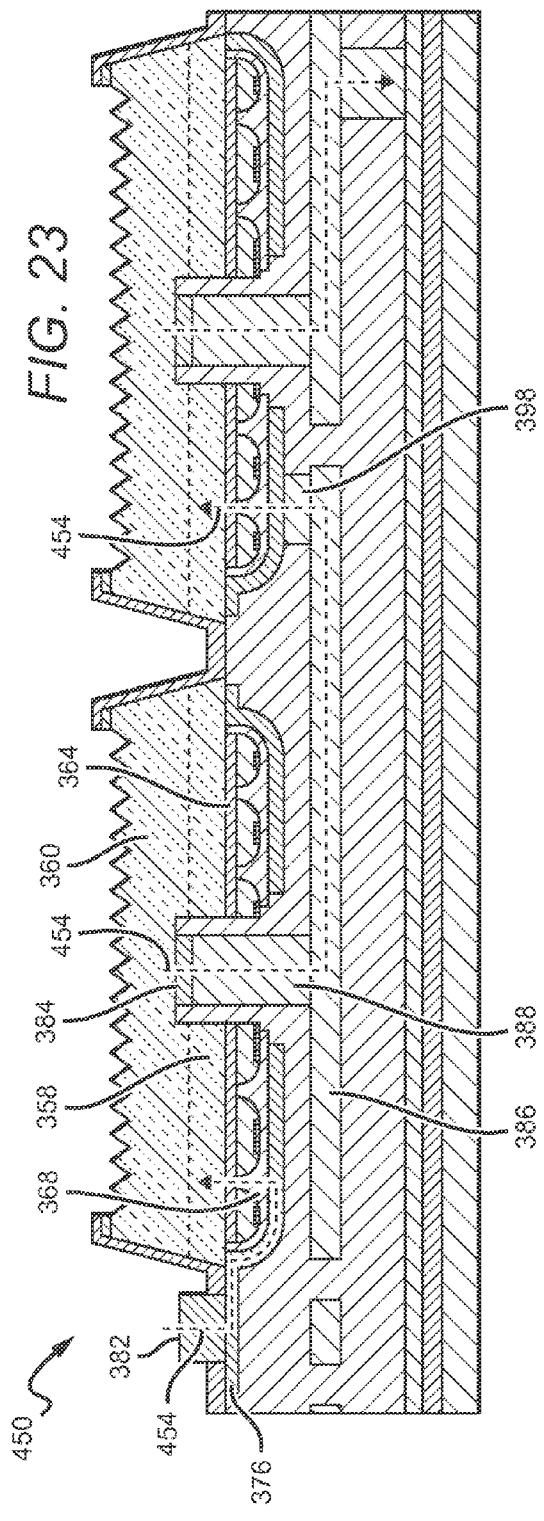
FIG. 22
FIG. 23

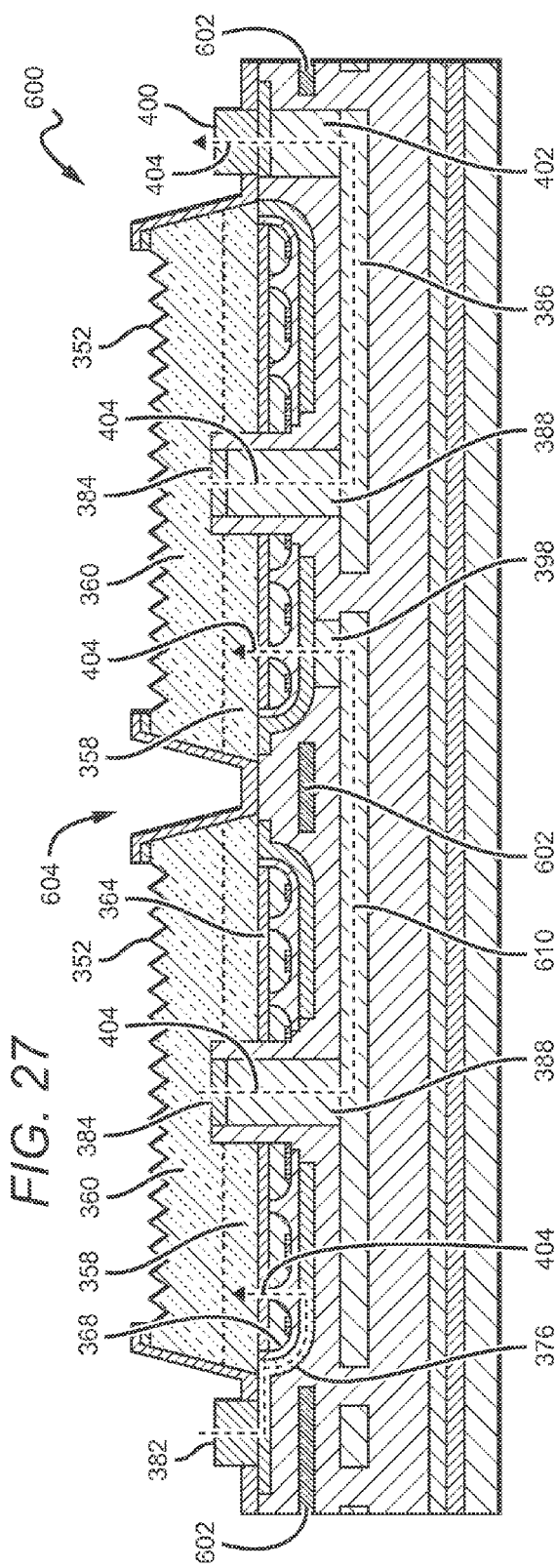
FIG. 27
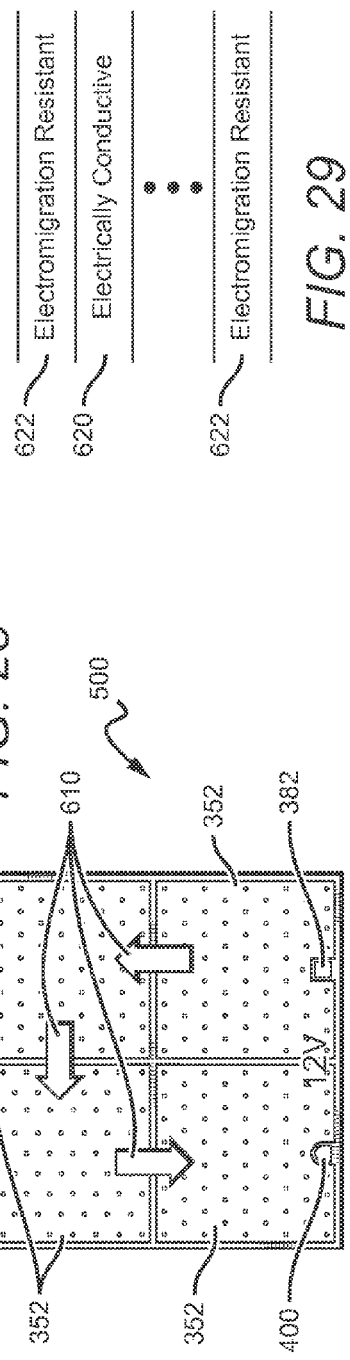
FIG. 28
FIG. 29

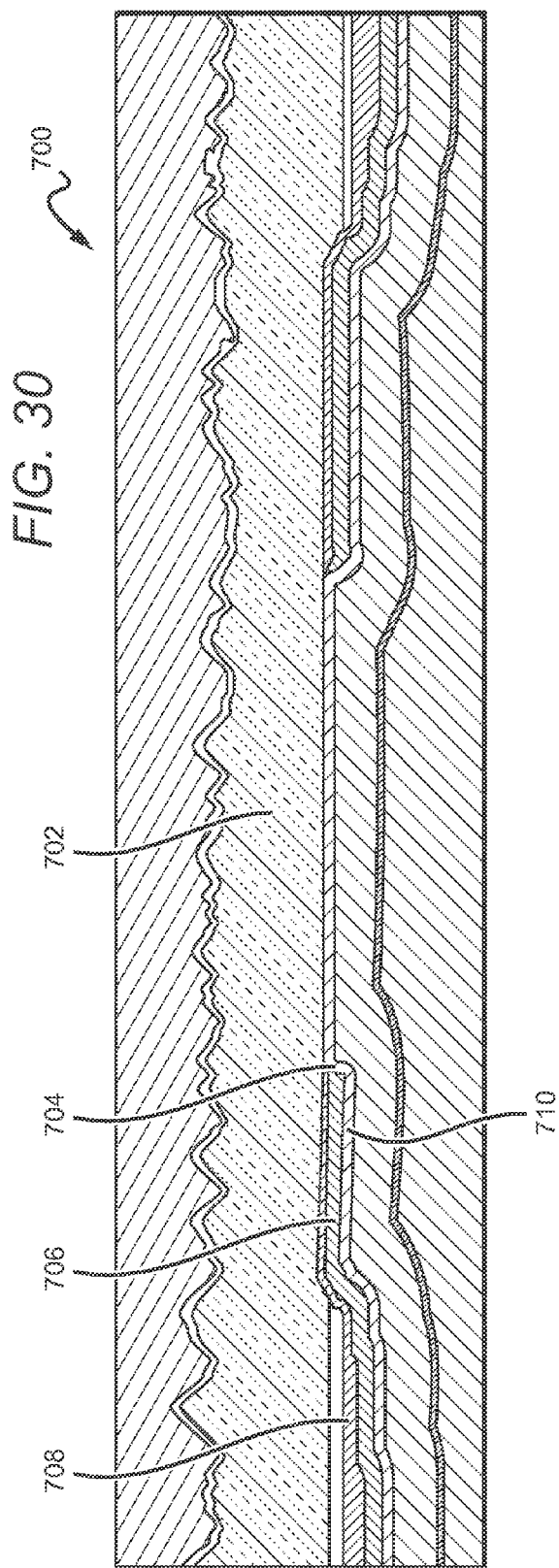

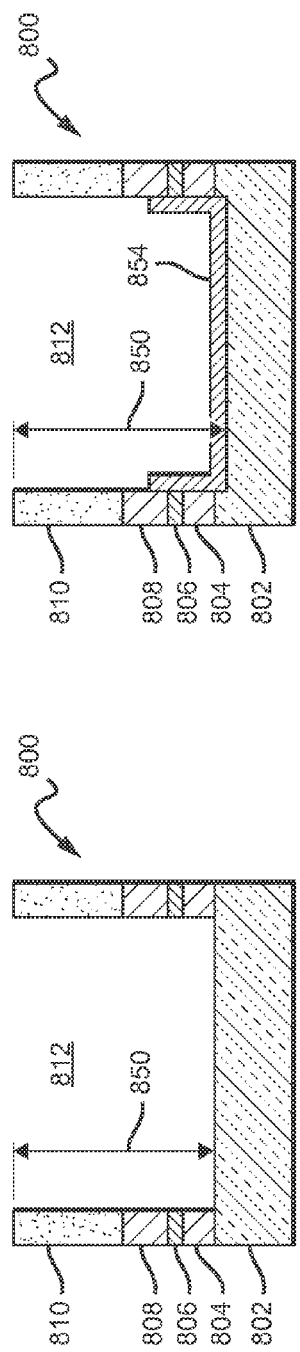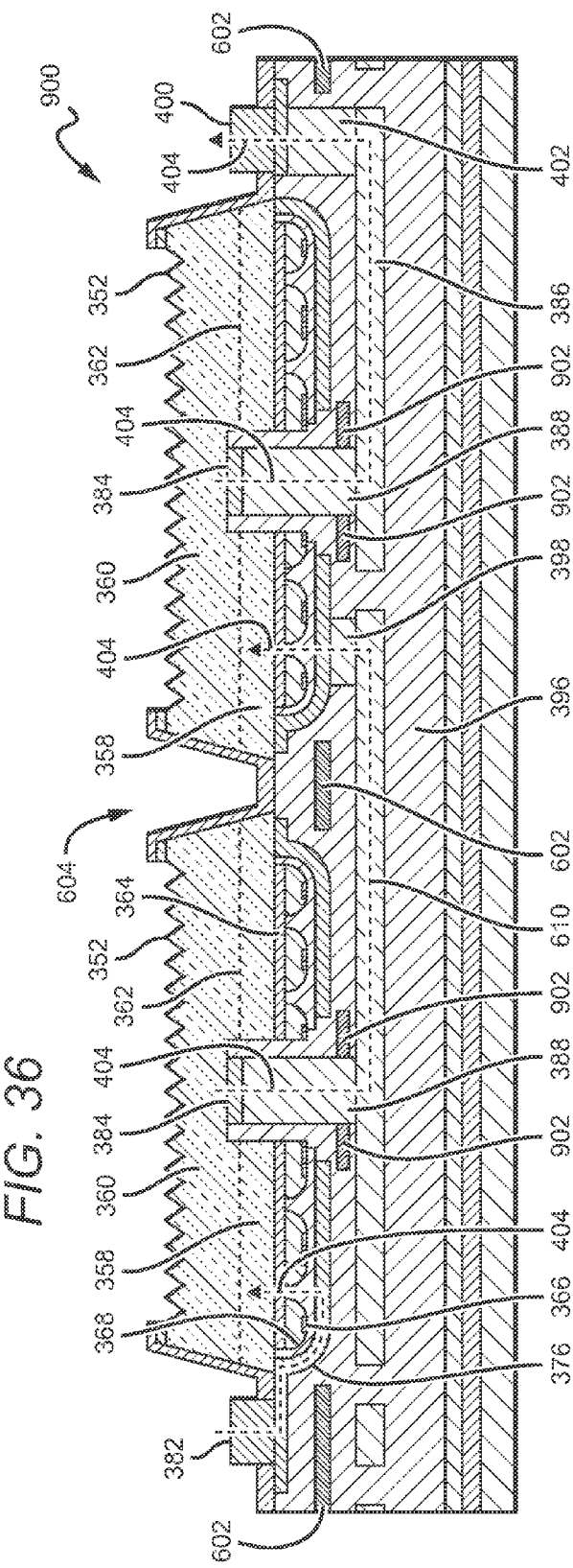

SELF-ALIGNED FLOATING MIRROR FOR CONTACT VIAS

CROSS REFERENCE TO RELATED APPLICATIONS

This application is a continuation-in-part of, and claims the benefit of, U.S. patent application Ser. No. 14/699,302 to Williams et al., filed on Apr. 29, 2015, which is a continuation-in-part of, and claims the benefit of, U.S. patent application Ser. No. 14/050,001 to Haberern et al., filed on Oct. 9, 2013, which is a continuation-in-part of, and claims the benefit of, U.S. patent application Ser. No. 13/168,689 to Bergmann et al., filed on Jun. 24, 2011. Each of these applications is hereby incorporated herein in their entirety by reference.

BACKGROUND OF THE INVENTION

Field of the Invention

Described herein are methods and devices relating generally to light emitting diode (LED) devices, and specifically to LED devices comprising mirror layers and contact vias.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

For typical LEDs it is desirable to operate at the highest light emission efficiency, and one way emission efficiency can be measured is by the emission intensity in relation to the input power, or lumens per watt. One way to maximize emission efficiency is by maximizing extraction of light emitted by the active region of LEDs. For conventional LEDs with a single out-coupling surface, the external quantum efficiency can be limited by total internal reflection (TIR) of light from the LED's emission region. TIR can be caused by the large difference in the refractive index between the LED's semiconductor and surrounding ambient. Some LEDs have relatively low light extraction efficiencies because of the high index of refraction of the substrate compared to the index of refraction for the surrounding material (e.g. epoxy). This difference results in a small escape cone from which light rays from the active area can transmit from the substrate into the epoxy and ultimately escape from the LED package.

Light that does not escape can be absorbed in the semiconductor material or at surfaces that reflect the light.

Different approaches have been developed to reduce TIR and improve overall light extraction, with one of the more popular being surface texturing. Surface texturing increases the light escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002]. Additionally, U.S. Pat. No. 6,657,236, also assigned to Cree Inc., discloses structures formed on the semiconductor layers for enhancing light extraction in LEDs.

Another way to increase light extraction efficiency is to provide reflective surfaces that reflect light so that it contributes to useful emission from the LED chip or LED package. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected. Some light may be absorbed by the reflector cup due to the less than 100% reflectivity of practical reflector surfaces. Some metals can have less than 95% reflectivity in the wavelength range of interest.

FIG. 2 shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

The reflectors shown in FIGS. 1 and 2 are arranged to reflect light that escapes from the LED. LEDs have also been developed having internal reflective surfaces to reflect light internal to the LEDs. FIG. 3 shows a schematic of an LED chip 30 with an LED 32 mounted on a submount 34 by a metal bond layer 36. The LED further comprises a p-contact/reflector 38 between the LED 32 and the metal bond 36, with the reflector 38 typically comprising a metal such as silver (Ag). This arrangement is utilized in commercially available LEDs such as those from Cree® Inc., available under the EZBright™ family of LEDs. The reflector 38 can reflect light emitted from the LED chip toward the submount back toward the LED's primary emitting surface. The reflector also reflects TIR light back toward the LED's primary emitting surface. Like the metal reflectors above, reflector 38 reflects less than 100% of light and in some cases less than 95%. The reflectivity of a metal film on a semiconductor layer may be calculated from the materials' optical constants using thin film design software such as TFCalc™ from Software Spectra, Inc. (www.sspectra.com). U.S. Pat. No. 7,915,629, also assigned to Cree Inc. and fully incorporated herein by reference, further discloses a higher efficiency LED having a composite high reflectivity layer integral to the LED for improving emission efficiency.

In LED chips having a mirror contact to enhance reflectivity (e.g. U.S. Patent Publication No. 2009/0283787, which is incorporated in its entirety herein by reference), the light extraction and external quantum efficiency (EQE) is strongly affected by the reflectivity of the mirror. For example, in a mirror comprised of Ni/Ag, the reflectivity is dominated by the properties of the Ag, which is >90% reflective. However, as shown in FIG. 4, such a mirror 40 is traditionally bordered by a metal barrier layer 42 that encompasses the edges of the mirror, with the barrier layer 42 provided to prevent Ag migration during operation. The metal barrier layer 42 has much lower reflectivity than the mirror (e.g. 50% or lower), and the portions of the barrier layer 42 contacting the active layer 44 outside the mirror 40 periphery can have a negative effect on the overall efficiency of the LED chip. This is because such portions of the metal barrier layer 42 absorb many of the photons that would otherwise exit the chip. FIG. 5 depicts another LED chip 50 in the EZ family of Cree, Inc. lights, with the chip 50 comprising a mirror 52 disposed below an active region 54. As in FIG. 4, a barrier layer 56 is provided that borders mirror 52 as well as extending outside the periphery of the mirror. Those portions of the metal barrier layer extending beyond the edges of the mirror 52 can likewise absorb some of the light emitted from the LED(s) and impact the overall emitting efficiency of the chip.

In LED chips comprising a plurality of junctions or sub-LEDs, such as those disclosed in U.S. Pat. No. 7,985,970, and U.S. Patent Pub. No. 2010/0252840 (both assigned to Cree Inc. and incorporated entirely herein by reference), the effect of the metal barrier layer can be particularly pronounced. FIG. 6 depicts a monolithic LED chip comprising a plurality of sub-LEDs and a plurality of contact vias 62. Portions of barrier layers 64, as represented by the dark circles at the peripheries of the vias 62, are exposed and illustrate the dimming effect that can result from such exposure of underling layers, such as the barrier layer. The effect can be very pronounced when comparing the efficiency of large, single-junction chips to multi-junction chips of the same footprint. This is because the smaller the junction is relative to the barrier layer exposed at the mirror periphery, the more severe the impact is on the overall emission efficiency of the device. For example, a 16-junction, 1.4 mm LED chip can be approximately 10% dimmer than a single-junction 1.4 mm chip.

Another source of such dark circle dimming around the vias 62 as shown in FIG. 6 is the utilization of "dark metals" having light absorptive and/or low reflective properties as interconnect layer material within and around the edges of the via 62. Interconnect layers can be utilized to connect adjacent junctions or sub-LEDs. The dark metals include such metals such as Titanium (Ti), Nickel (Ni), Tungsten (W), and a Titanium Tungsten alloy (TiW) and are utilized as interconnect layer material due to their resistance to electromigration; however, like the barrier layers 64 above, the dark metal interconnect layers exhibit a dimming effect that negatively affects LED chip light output.

It is difficult to resolve the issue of the dark circles around the vias 62 caused by the visible portions of the barrier layer and/or interconnect layers through conventional means. For example, there are limitations as to how close to the via 62 conventional mirror layers, often carrying current, can be designed without risking causing a short and therefore device malfunction. Conventional mirror layers should therefore be designed at some "tolerance distance" from the vias 62. The spatial gap caused by this tolerance distance allows for more of the underlying dark material to affect light output. Additionally, even if one were to apply a mirror layer at a tolerance distance, the corresponding manufacturing process requires a significant degree of precision to obtain the correct tolerance distance.

SUMMARY OF THE INVENTION

Described herein are LED chips comprising self-aligned mirror layers that are floating, for example, by being substantially electrically isolated by an insulating material. These floating self-aligned mirror layers are configured with contact vias and can be positioned such that they extend from a position substantially near the edge of the contact vias or from a position directly at the edge of the vias. In some embodiments, the mirror layers are substantially surrounded by an insulating material except for a portion of the mirror layer that contacts the edge of the contact vias. These mirror layers can eliminate or mitigate the dark circle dimming effect around the vias of an LED device caused by portions of underlying material layers, such as the barrier layers and interconnect layers discussed above, without the need of achieving a tolerance distance. These mirror layers can also self-align with the vias during device fabrication and therefore eliminate or mitigate the need for precision alignment during the fabrication process.

While the self-aligned floating mirror layers disclosed herein are useful in any LED device having one or more contact vias, including single-junction devices, these mirror layers are particularly useful in multiple junction LED chips utilizing interconnect layers, for example, monolithic LED chips having a plurality of active areas on a substrate/submount ("submount") that can be interconnected in series; although, it is understood that other embodiments can have active regions interconnected in parallel or in a series parallel combination. The active areas can be arranged in close proximity such that space between adjacent ones of the active areas is substantially not visible when the emitter is emitting, thereby allowing the LED chip to emit light similar to that of a filament.

Overall emission of the LEDs can also be improved by reducing the light-absorbing effects of materials, such as barrier layers, adjacent to the mirror(s). Some embodiments are described below as having active regions arranged linearly, but it is understood that the LED chips according to the present invention can be arranged in many different shapes with their active regions arranged in many different locations and patterns in relation to one another. Some of the different shapes include different polygon shapes like triangle, square, rectangle, pentagon, etc.

Some embodiments of the present invention can be arranged to provide for improved reliability under high power or high current operation. Some of these embodiments can have layer structures or composition that help minimize or eliminate electromigration during high power LED chip operation. Some embodiments of a monolithic LED chip, according to the present invention comprises a plurality of active regions, with an electrically conductive interconnect element connecting at least two of the active regions. The interconnect element can comprises a material and/or structure that resists electromigration.

In some embodiments, an LED chip comprises a first active region comprising two oppositely doped layers and an active layer therebetween, at least one electrical connection via providing a path for electrical connection to one of the oppositely doped layers, and a floating mirror layer extending substantially from a position near the edge of the electrical connection via.

In other embodiments, an LED chip comprises a plurality of active regions physically separated from one another, with each active region comprising two oppositely doped layers and an active layer therebetween. The LED chip further comprises at least one interconnect layer connecting one of the doped layers of one active structure with an oppositely doped layer of another active structure, wherein at least a portion of the interconnect layer is in an electrical connection via. The electrical connection via provides a path for electrical connection to one of the active structures in said plurality. The LED further comprises a floating mirror layer extending from a position substantially near the edge of the electrical connection via.

In yet other embodiments, a method of fabricating an electrical connection via with a self-aligned floating mirror layer for an LED chip comprises the steps of depositing a first insulating material on a semiconductor based active structure. The next step involves depositing a mirror layer on the first insulating material. Then the next step involves depositing a second insulating material on the mirror layer. The subsequent step involves depositing a photoresist mask on the second insulating layer, leaving at least one portion of the surface of said second insulating layer unmasked. The final step involves etching through the at least one unmasked portion to said semiconductor based active structure, creating an electrical connection via to a portion of the semiconductor based active structure.

These and other aspects and advantages of the invention will become apparent from the following detailed description and the accompanying drawings which illustrate by way of example the features of the invention.

BRIEF DESCRIPTION OF THE DRAWINGS

FIG. 8 is a sectional view of another embodiment of an LED chip according to the present invention;
FIG. 9 is a sectional view of another embodiment of an LED chip according to the present invention;
FIG. 16 is a sectional view of one embodiment of a monolithic LED chip according to the present invention;
FIG. 17 is a sectional view of the LED chip shown in FIG. 16 at an intermediate manufacturing step;
FIG. 22 is a sectional view of another embodiment of a monolithic LED chip according to the present invention;
FIG. 23 is a sectional view of the LED chip in FIG. 22 showing flow of an electrical signal;
FIG. 27 is a sectional view of the LED chip in FIG. 26 showing flow of an electrical signal;
FIG. 28 is a top view of the another embodiment of a monolithic LED chip according to the present invention showing flow of an electrical signal;
FIG. 29 is a sectional view of one embodiment of an interconnection metal layer according to the present invention;
FIG. 30 is a front sectional view of still another embodiment of an LED chip incorporating features of the present invention;
FIG. 31 is a front sectional view of a portion of an LED chip undergoing a first step of a method for the formation of a contact via and a self-aligned floating mirror layer incorporating features of the present invention;
FIG. 32 is a front sectional view of a portion of an LED chip undergoing a second step of a method for the formation of a contact via and a self-aligned floating mirror layer incorporating features of the present invention;
FIG. 33 is a front sectional view of a portion of an LED chip undergoing a third step of a method for the formation of a contact via and a self-aligned floating mirror layer incorporating features of the present invention;
FIG. 34 is a front sectional view of a portion of an LED chip undergoing a fourth step of a method for the formation of a contact via and a self-aligned floating mirror layer incorporating features of the present invention;
FIG. 35 is a front sectional view of a portion of an LED chip undergoing a fifth step of a method for the formation of a contact via and a self-aligned floating mirror layer incorporating features of the present invention;
and
FIG. 36 is a front sectional view of still a further embodiment of an LED chip incorporating features of the present invention showing an example current flow through the LED chip.

DETAILED DESCRIPTION OF THE INVENTION

Figure 1:
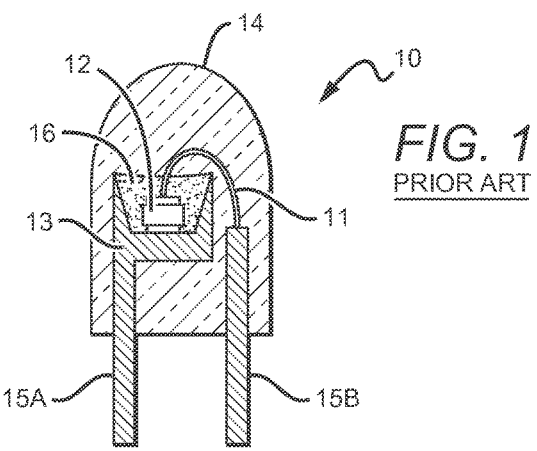
FIG. 1 is a sectional view of a prior art LED package.
Figure 2:
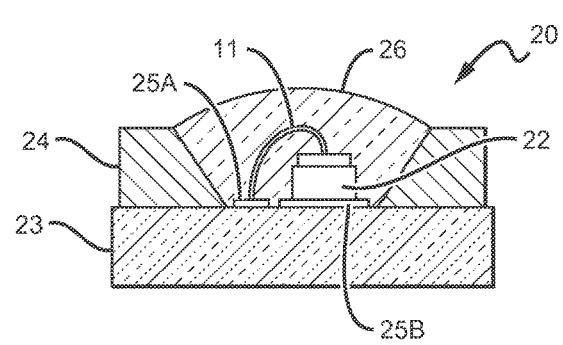
FIG. 2 is a sectional view of another prior art LED package.
Figure 3:
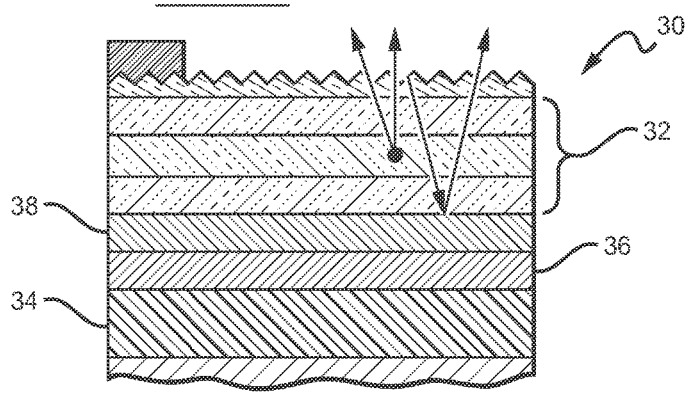
FIG. 3 a sectional view of another embodiment of a prior art LED chip.
Figure 4:
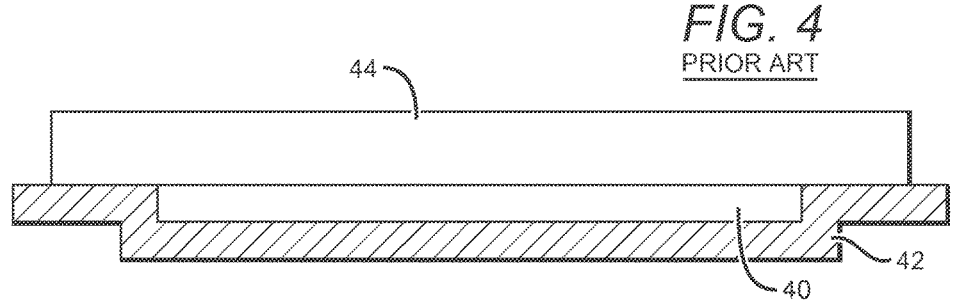
FIG. 4 is a sectional view of a prior art LED chip according to the present invention.
Figure 5:
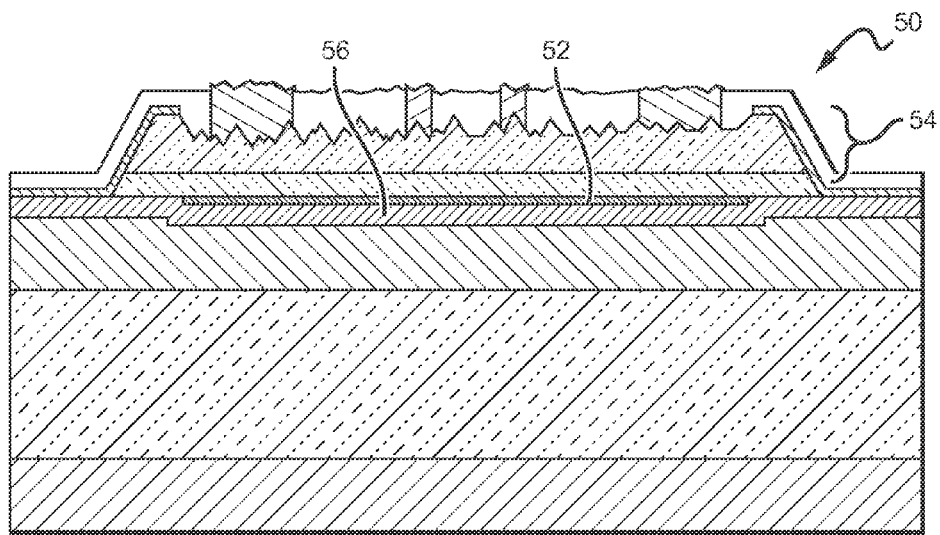
FIG. 5 is a sectional view of a prior art LED chip according to the present invention.

The present invention is described herein with reference to certain embodiments, but it is understood that the invention can be embodied in many different forms and should not be construed as limited to the embodiments set forth herein. These embodiments set forth methods and devices pertaining to LED-based devices, for example, LED chips comprising electrical connection vias. Embodiments incorporating features of the present invention include reflective layers, such as floating mirror layers that self-align with an electrical contact via during device fabrication. This can eliminate the need for precise placement of the mirror layer during device fabrication.

Furthermore, as the self-aligned floating mirror layers are floating, and thus substantially surrounding by electrically insulating material, these mirror layers do not need to be designed at a tolerance distance from the edges of the via, which typically arises due to concerns with causing a device short and subsequent malfunction. This increases the mirror area and eliminates lower light reflection in the proximity of electrical connection vias. These two advantages lead to a higher light output design with greater light output uniformity.

In some embodiments, the self-aligned floating mirror layer can be formed simultaneously or near simultaneously with an electrical connection via. In these embodiments, the mirror layer is deposited on a semiconductor active structure such that it is between two layers of insulating material. A photoresist mask defining an etch area is then deposited on the topmost insulating layer, which in turn is on the mirror layer. The unmasked portion of the layers is then etched through to the semiconductor active structure so that the electrical connection can be made to it. This process is shown in greater detail with reference to FIGS. 31-35 herein.

In some embodiments according to the present invention, LED chip structures are provided to enhance the overall emission characteristics of LEDs. The emission characteristics of LED chip structures having mirror reflectivity are generally enhanced by limiting the amount of dark or substantially non-reflective barrier material around the periphery of highly reflective mirror components. In LED chips having p-contacts with integral mirrors rather than ITO (such as in the EZ family of chips provided by Cree, Inc.), the light extraction and EQE is strongly affected by the reflective characteristics of the mirror. For example, in a mirror comprised of Ni/Ag, the reflectivity is dominated by the properties of the Ag and is believed to be around 90% reflective. This high reflectivity can be counteracted by a barrier layer, which is used to prevent Ag migration during operation of the LED chip at high temperatures and/or in humid conditions. The barrier layer, if allowed to extend substantially beyond the periphery of the mirror, can significantly adversely affect the reflectivity of the mirror since it generally has a reflectivity of 50% or lower and can absorb many of the photons that would otherwise be exiting and emitting from the chip.

Thus, in certain embodiments of LED chip structures according to the present invention, barrier layers are provided that are patterned smaller than the mirror layers they are protecting. As such, the barrier layers are preferably no longer wrapping around the edges of the mirror, and thus are not exposed to light trapped within the GaN active region. In still other embodiments, there can be multiple sub-LEDs connected via junctions to comprise one LED chip. In such structures, there will necessarily be a small portion of the barrier layer that is exposed outside a portion of the mirror periphery in order to create a connection between the p-contact of one LED and the n-contact of an adjacent LED. In such embodiments, the amount of the barrier that is exposed is minimized such that at least 40% of the mirror periphery is free from the barrier layer and its associated adverse effects. In other embodiments, at least 50% of the mirror periphery is free from the barrier layer, while in other embodiments at least 60% is free from the barrier layer.

In other embodiments, LED chips structures are provided having a plurality of active areas/portions/regions ("regions") that can be provided on a submount having internal and integral electrical interconnects to connect the LEDs in different series connections. In different embodiments, the active regions can be distinct from each other, with each having its own set of oppositely doped layers and active layer not otherwise connected to same layers in the other active regions.

The submount can also have a barrier layer that does not extend beyond the edge of or wrap around the portions of the mirror layer, with the portion being particularly below the primary emission area of the active regions. This can help minimize the light that might be absorbed during operation, thereby increasing the overall emission efficiency of the active regions.

The submounts internal electrical connections can be particularly arranged to allow for interconnection of the active regions so that each is relatively close to the adjacent ones of the active regions. During emission of the monolithic LED chips according to the present invention, the small space between the active regions reduces or eliminates dark spots between the active regions so that the LEDs appear as a continuous light source. This arrangement allows for monolithic LEDs that give the appearance of a conventional filament light source, while at the same time maximizing the emission area of the LED chips to increase overall brightness.

Some embodiments of LED chips according to the present invention have a plurality of active areas regions on a submount and buried electrical interconnects that can present certain reliability problems, particularly under high power operation. For example, in some of these embodiments the buried electrical interconnects can experience electromigration of certain layers or materials during operation, which can lead to degradation and eventual failure of the device. One layer that can experience electromigration is the buried electrical interconnect. To address this, some embodiments of the present invention can be arranged to reduce, minimize or eliminate this electromigration. Some embodiments can have layers structure that allow for the use of materials for the current carrying layer that resist electromigration. Still other embodiments can have current carrying layers made of multiple layers with the outermost of the layers having lower tendency to electromigrate. Still other embodiments provide layers as an alloy of materials that also helps minimize electromigration.

It will be understood that when an element is referred to as being "on", "connected to", "coupled to", or "in contact with" another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

It is understood that when a first element is referred to as being "between," "sandwiched," or "sandwiched between," two or more other elements, the first element can be directly between the two or more other elements or intervening elements may also be present between the two or more other elements. For example, if a first layer is "between" or "sandwiched between" a second and third layer, the first layer can be directly between the second and third layers with no intervening elements or the first layer can be adjacent to one or more additional layers with the first layer and these additional layers all between the second and third layers.

In order to use an LED chip in a circuit or other like arrangement, it is known to enclose an LED chip in a package to provide environmental and/or mechanical protection, color selection, light focusing and the like. It is understood that the term "LED" can be used herein to refer to an LED chip, LED component, and LED package interchangeably. An LED package can also include electrical leads, contacts or traces for electrically connecting the LED package to an external circuit.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946, 547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods such as electrophoretic deposition (EPD), with a suitable EPD method described in U.S. patent application Ser. No. 11/473, 089 entitled "Close Loop Electrophoretic Deposition of Semiconductor Devices", which is also incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

Figure 7:
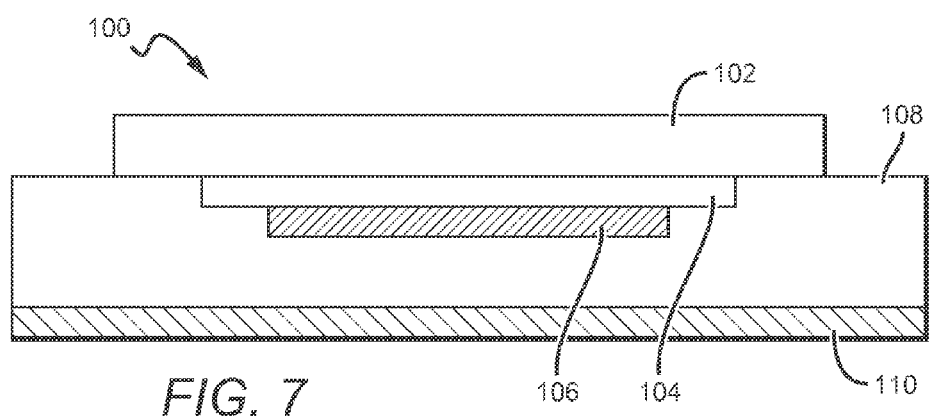
FIG. 7 is a sectional view of one embodiment of an LED chip according to the present invention.

FIG. 7 shows one possible embodiment of a LED chip 100 according to the present invention. LED chip 100 generally comprises a GaN active region 102, a Ni/Ag-based mirror contact 104, a metal barrier 106, an insulator 108, and a reflective metal 110. The structure depicted in FIG. 7 is intentionally simplified for illustrative purposes, and it is understood that a chip according to the present invention could include additional components as discussed above or below in more detail and/or as is well known in the art, and could likewise include other suitable materials as discussed above or below in more detail. Thus, it is understood that additional layers and elements can also be incorporated, including but not limited to buffer, nucleation, contact and current spreading layers as well as light extraction layers and elements. It is also understood that the oppositely doped layers can comprise multiple layers and sub-layers, and well as supper lattice structures and inter layers. The active region can comprise single quantum well (SQW), multiple quantum well (MQW), double heterostructure or super lattice structures. The order of the layers can be different and in the embodiment shown, the first or bottom epitaxial layer can be an n-type doped layer and the second or top epitaxial layer can be a p-type doped layer, although in other embodiments the first layer can be p-type doped and the second layer n-type doped. Embodiments where the p-type layer is the bottom layer typically correspond with LEDs that are flip-chip mounted on a submount. In flip-chip embodiments it is understood that the top layer can be the growth substrate, and in different embodiments all or a portion of the growth substrate can be removed. In those embodiments where the growth substrate is removed, the n-type doped layer is exposed as the top surface. In still other embodiments portions of the growth substrate can be left and in some embodiments can be shaped or textured to enhance light extraction.

Each of the LEDs in the chips discussed herein can have first and second contacts, and in the embodiment shown in FIG. 7, the LED has lateral geometry. As such, the LED can be contacted from one side or surface of the LED, instead of top and bottom surfaces as is the case for vertical geometry. The first and second contacts can comprise many different materials such as gold (Au), copper (Cu) nickel (Ni), indium (In), aluminum (Al), silver (Ag), or combinations thereof. Still other embodiments can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2$/Sb, $Ga_2O_3$/Sn, $AgInO_2$/Sn, $In_2O_3$/Zn, $CuAlO_2$, LaCuOS, $CuGaO_2$ and $SrCu_2O_2$. The choice of material used can depend on the location of the contacts as well as the desired electrical characteristics such as transparency, junction resistivity and sheet resistance.

Some embodiments of LED chips according to the present invention can have other features, and Group-III nitride based LEDs, for example, can have other features to assist in spreading current from the contacts. This is particularly applicable to spreading current into p-type Group-III nitrides and the current spreading structure can comprise thin semitransparent current spreading layer covering some or the entire p-type layer. These layers can comprise different materials including but not limited to a metal such as platinum (Pt) or a transparent conductive oxide such as indium tin oxide (ITO).

Submounts can be formed of many different materials such as silicon, ceramic, alumina, aluminum nitride, silicon carbide, sapphire, or a polymeric material such as polymide and polyester etc. In other embodiments the submount can include a highly reflective material, such as reflective ceramics, dielectrics or metal reflectors like silver, to enhance light extraction from the component. In other embodiments the submount can comprise a printed circuit board (PCB), or any other suitable material, such as T-Clad thermal clad insulated substrate material, available from The Bergquist Company of Chanhassen, Minn. For PCB embodiments different PCB types can be used such as standard FR-4 metal core PCB, or any other type of printed circuit board.

In LED chip 100, the barrier layer 106 does not wrap around the edges of the mirror 104 as it does in the prior art. Instead, the barrier layer 106 is patterned smaller than the mirror 104 such that it is not exposed to the light emitted toward the mirror or trapped inside the GaN region 102. In some embodiment, most of the barrier 106 may be removed in at least one embodiment so long as the insulator 108 fulfills the duties of the barrier 106. The areas of the mirror 104 no longer bordered by the barrier 106 are instead surrounded by insulator 108, with the insulator being crucial for preventing Ag migration from the mirror 104. As such, the insulator 108 preferably has high density, high bond strength, low moisture permeability, and high resistance to metal ion diffusion. Additionally, the interface between the insulator 108 and the GaN region 102 is critical, as a weak interface can lead to Ag migration despite having an insulator 108 of high quality. Moreover, the insulator 108 may be optically transparent, and helps space the reflective metal layer 110 from the mirror 104.

Below the insulator 108, a reflective metal layer 110 may also be disposed such that it forms a composite barrier with the insulator and preferably has significantly higher reflectivity than the metal barrier 106. Any light incident on the composite barrier at high angles may experience total internal reflection at the GaN/insulator interface due to the refractive index difference, while low angle light may get reflected off the bottom reflective layer 110. The reflective layer 110 preferably consists of a high reflectivity metal such as Al or Ag, although it is understood that other suitable materials may also be used. The reflectivity of the composite barrier may be greater than 80%, or alternatively may be greater than 90%.

The insulator 108 may have low optical absorption and a low refractive index in order for the composite barrier to be highly reflective. Since the optical and reliability requirements of the insulator 108 may be at odds with one another, the insulator may comprise two or more distinct layers (not shown). For example, the insulator 108 may comprise a thin layer having properties optimized to prevent Ag migration in places where it is in contact with the mirror 104 and the GaN region 102, and the insulator 108 may comprise a second, thicker layer having a low index of refraction in between the reflective metal 110 and the thin layer. As such, total internal reflection can occur at the interface between the thin and thick insulator layers, provided the thicker layer is at least a few optical wavelengths thick. A suitable thickness for the thick insulator layer may be between 0.5-1 m. In another example, the insulator 108 may comprise three distinct layers, such as the first two as discussed above and a third layer in between the thick layer and the reflective metal layer 110, with the third layer being optimized for good adhesion to the reflective metal layer 110. In yet a further example, a composite barrier may comprise more than three insulator layers, in which reflectivity of the composite barrier is further increased by alternating high and low refractive index insulator materials.

The insulator 108 may be comprised of many different suitable materials, including an oxide, nitride, or oxynitride of elements Si or Al. In insulators comprising two layers as discussed above, the first layer may be comprised of an oxide or oxynitride of Ti or Ta, while the second, thicker layer may be comprised of a low refractive index material such as $SiO_2$. In insulators comprising three layers, the materials may be the same as a two-layer insulator, with the third layer adjacent the reflective metal layer 110 comprised of SiN. While these materials fit the requirements for single or multiple layer insulators as discussed above, it is understood that other suitable materials may also be used and contemplated in the context of the present invention.

FIG. 8 depicts another embodiment of a LED chip 120 according to the present invention. The chip 120 may comprise all the components as discussed with chip 100. Also, as described with chip 100, LED chip 120 comprises a GaN region 122, an Ag-based mirror 124, a metal barrier 126, an insulator 128, and a reflective metal layer 130. However, FIG. 8 further depicts a p-contact being connected to a location outside the junction through a via connection 132. As indicated above, the mirror 124 may also serve as the p-contact for the LED. For purposes of connecting the p-contact to a location outside the junction, the metal barrier 126 may go outside the periphery of the mirror 124 and the GaN region 122 junction. This section can then be coupled to the via connection 132, so that an electrical signal applied to the mirror 124 conducts through the via 132 to the extending portion (illustrated by the crosshatched portion 127 of the barrier 126) and to the GaN region. If the section of the metal barrier 126 extending outside the periphery of the mirror 124 is sufficiently small and narrow compared to the overall length of the mirror's periphery, then the poor reflectivity of the barrier 126 will have a negligible impact on light extraction. In one embodiment, the width of the barrier 126 portion 127 outside the mirror 124 periphery is ~20 μm or less.

FIG. 9 depicts another embodiment of a LED chip 140 according to the present invention, with chip 140 being a multi-junction chip. Providing such a multi-junction chip is one way to get an array of LEDs having high output on higher voltages. The chip 140 may comprise all the components as discussed with chip 100. Also, as described with chip 100, LED chip 140 comprises GaN regions 142, Ag-based mirrors 144, metal barriers 146, an insulator 148, and a reflective metal layer 150. However, FIG. 9 further depicts a p-contact being connected to the n-contact 154 of an adjacent junction.

As indicated above, the mirror 144 may also serve as the p-contact for the LED. For purposes of connecting the p-contact to the n-contact 154 of an adjacent junction, the metal barrier 146 may go outside the periphery of the mirror 144 and the GaN region 142 junction. If the section 147 of the metal barrier 146 extending outside the periphery of the mirror 144 is sufficiently small and narrow compared to the overall length of the mirror's periphery, then the poor reflectivity of the barrier 146 will have a negligible impact on light extraction. Furthermore, the portion 147 of the metal barrier 146 may also be used to form a wire bond for connecting the p-contact to a package terminal. It is also noted that the metal barrier 146 does not have to cover a majority of the underside of the mirror 144 as depicted in the figures. In some embodiments, the mirror 144 may be substantially eliminated, and can be in contact with the mirror 144 in only a small section sufficient to form a good electrical contact.

LED chip 140 further comprises passivation layers 152, with the characteristics of passivation layers well known in the art. The passivation layers 152 may be comprised of SiN, which is a suitable material for providing moisture resistance to the chip. However, it is understood that other appropriate materials may be used, such as $SiO_2$. $SiO_2$ is not as moisture resistant as SiN.

Figure 6:
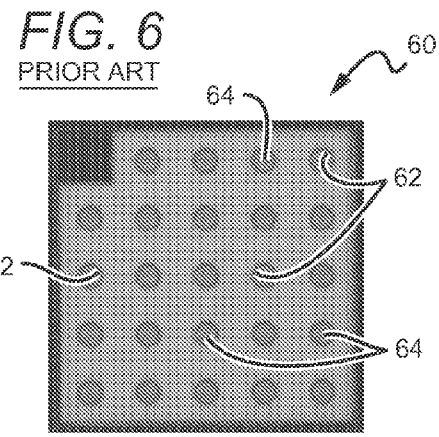
FIG. 6 is a top view of a prior art monolithic LED chip according to the present invention.
Figure 10:
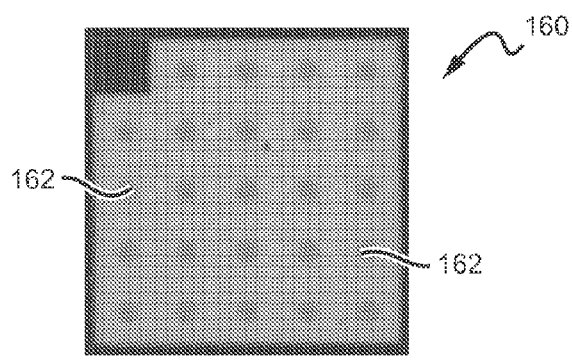
FIG. 10 is a top view of a monolithic LED chip according to the present invention.

FIG. 10 depicts a monolithic LED chip comprising a plurality of LEDs and a plurality of contact vias 162 as is discussed in more detail below with respect to FIG. 12. When compared to FIG. 6, it can be readily observed that the dark circles in FIG. 6 caused by the exposed portion of barrier layers 64 have been virtually eliminated in FIG. 10. This is because the barrier layers in FIG. 10 (not viewable from this perspective), have been made smaller than the mirror layers, and are thus not exposed and/or are minimally exposed at the periphery of said mirrors. Due to the reduction of the exposed barrier layers, any dimming effects of the barrier layers are substantially reduced and/or eliminated.

Figure 11:
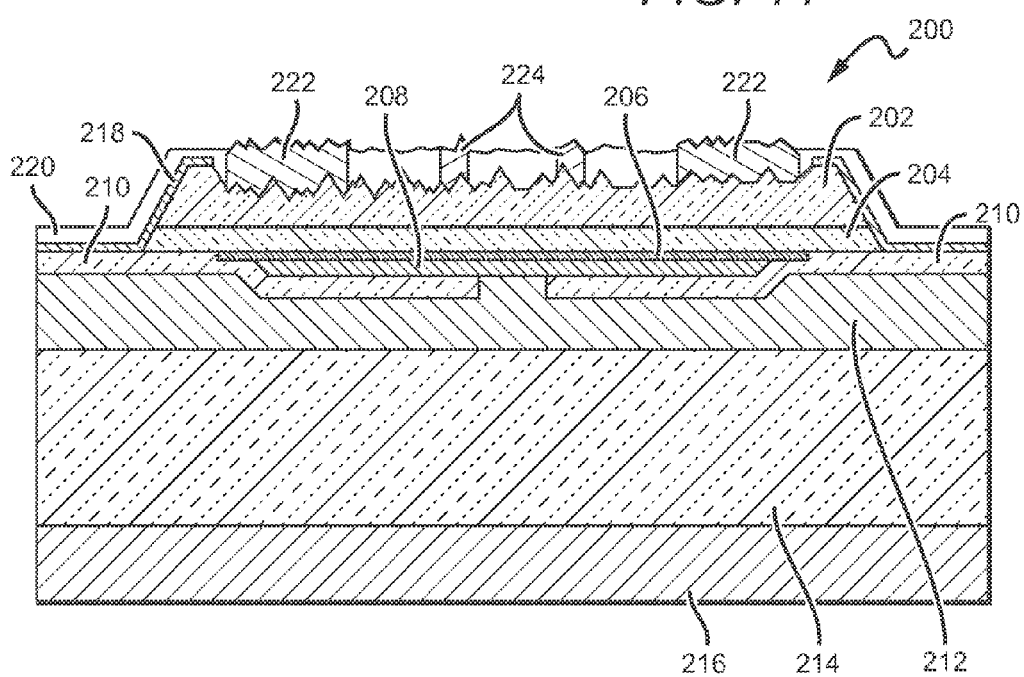
FIG. 11 is a sectional view of another embodiment of an LED chip according to the present invention.

FIG. 11 depicts another embodiment of a LED chip 200 according to the present invention. The chip 200 may comprise all the components as discussed with chip 100. FIG. 11 may further include a roughened n-GaN layer 202, a p-GaN layer 204, a mirror layer 206 (which may also serve as the p-contact for the LED), a barrier layer 208, a dielectric barrier layer 210, a bond metal layer 212, a carrier layer 214, a AuSn layer 216, passivation layers 218, 220 (with layer 220 at least partially roughened), and n-contacts 222, 224 on the roughened GaN layer. As discussed above, the roughened layers help with light extraction.

As illustrated, the barrier layer 208 in FIG. 11 is sized smaller than the mirror 206. As discussed above, such sizing of the barrier layer helps eliminate many of the light-absorbing effects inherent in layer 208, which in turn improves the overall emission and efficiency of the LED chip 200. In this embodiment (as well as in others), the characteristics of barrier layer 208 may allow it to act as a current spreading layer as well as a barrier for Ag migration and/or a protective layer for mirror 206, such that bond metal layer 212 is isolated from mirror 206 and thus does not dissolve into mirror 206. Bond metal layer 212 may be at least partially comprised of tin, which may otherwise dissolve into the mirror 206 but for the barrier 208. Bond metal layer 212 may further be reflective, although it may not be as highly reflective as mirror 206.

Passivation layers 218 are disposed on the sidewalls of the active region, providing sidewall passivation as is well known in the art. Passivation layers 218 may be comprised of SiN, which exhibits favorable moisture resistive characteristics. However, it is understood that other suitable materials are also contemplated. Passivation layer 220 may also be disposed over the device as shown to provide physical protection to the underlying components. Passivation layer 220 may be comprised of SiO$_2$, but it is understood that other suitable passivation materials are also contemplated.

The dielectric barrier layer 210 is provided, at least in part, to protect/isolate the mirror 206 and portions of barrier 208 from the bond metal layer 212. The dielectric layer may be transparent, and/or may comprise different dielectric materials such as SiN, SiO$_2$, Si, Ge, MgOx, MgNx, ZnO, SiNx, SiOx, alloys or combinations thereof. The dielectric layer 210 may also extend further under barrier 208 as depicted by the crosshatched sections under barrier 208.

Figure 12:
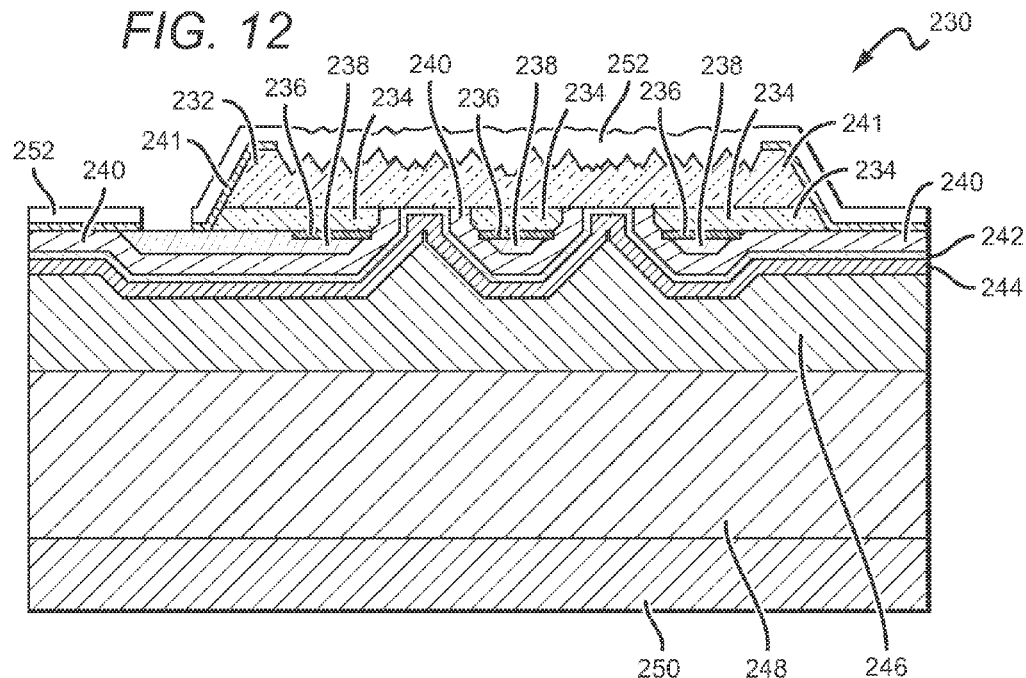
FIG. 12 is a sectional view of another embodiment of an LED chip according to the present invention.

FIG. 12 depicts another embodiment of a LED chip 230 according to the present invention. The chip 230 may comprise some or all of the components as discussed with the other chip embodiments. However, the biggest difference between chip 230 and the other chip embodiments is that n-contact vias are provided as shown in FIG. 12, with the vias not shown in FIG. 13 for ease of illustration. The vias allow for the removal of the n-contact metal on the topside of the device and the n-contact is essentially embedded within the device and electrically accessibly from the bottom of the chip. With less topside metal to block light emission, improved brightness can be realized. Furthermore, the barrier metal outside the periphery of the mirror is eliminated and/or substantially reduced, which further contributes to the emission efficiency of the device.

The vias according to the present invention can be formed using conventional methods, such as etching to form the openings for the vias and photolithographic processes for forming the via. The vias take only a fraction of the area on the LED chip that would be needed for a wire bond pad. By using one or more vias in place of a wire bond pad, less of the active area is removed and fewer emission blocking metal for contacts is located on the topside of the device. This leaves more LED active area for light emission, thereby increasing the overall efficiency of the LED chip.

It is also understood that different embodiments can have more than one via and the vias can be in many different locations. In those embodiments having multiple vias, the vias can have different shapes and sizes and can extend to different depths in the LED. It is also understood that different embodiments can also comprise vias used in place of the first wire bond pad.

FIG. 12 may further include a roughened n-GaN layer 232, p-GaN layers 234, mirror layers 236 (which may also serve as the p-contact for the LED), barrier layers 238, passivation layers 240, 241, an n-contact 242, barrier layer 244, a bond metal layer 246, a carrier layer 248, AuSn layer 250, and passivation layer 252. As discussed above, the roughened layers assist with improved light extraction of the device.

As with other embodiments discussed herein, the barrier layers 238 are sized such that they are smaller than the mirror layers 236 and/or are prevented from extending beyond 40% or more of the periphery of the mirrors 236. The barrier layers 238 may be further provided to form a contact at the topside of the device for the p-contact integral to at least a portion of mirrors 236. As best shown in Furthermore, the barrier layers 238 may help spread current laterally through the device since the mirrors 236 may be too thin to effectively spread current.

The barrier layer 244 may be provided as a protective layer for n-contact 242, such that bond metal layer 246 is isolated from n-contact 242 and thus does not dissolve into or otherwise adversely react with n-contact 242. Barrier layer 244 may be comprised of TiW/Pt, although it is understood that other suitable materials are contemplated. In some embodiments, barrier layer 244 may not be necessary depending on the material make-up of the n-contact 242 and bond metal layer 246. The n-contact may be comprised of a variety of suitable materials, with preferred materials being reflective to further enhance the light emission of the device. As such, n-contact 242 may be comprised of Al, Ag, or other reflective materials. Bond metal layer 246 may further be reflective.

Passivation layers 241 are disposed on the sidewalls of the active region, providing sidewall passivation as is well known in the art. Passivation layers 240, 241 may be comprised of SiN, which exhibits favorable moisture resistive characteristics. However, it is understood that other suitable materials are also contemplated.

Passivation layer 252 may also be disposed over the device as shown to provide physical protection to the underlying components. Passivation layer 252 may be comprised of SiO$_2$, but it is understood that other suitable passivation materials are also contemplated.

Figure 13:
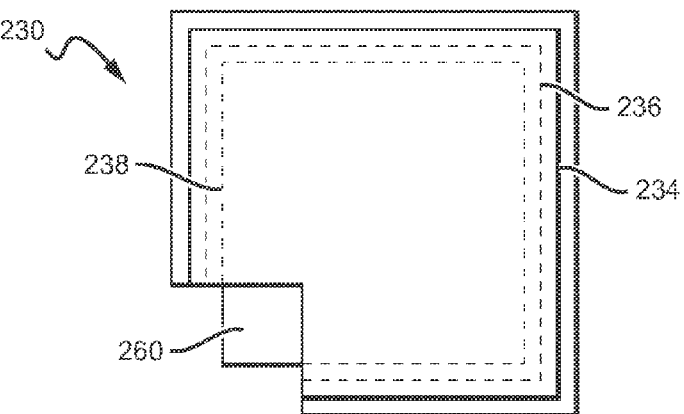
FIG. 13 is a top view of one embodiment of an LED chip according to the present invention.

FIG. 13 is a top view of the LED chip 230 shown in FIG. 12, with FIG. 13 showing the n-type layer 234 and the outer edge of the mirror 236 below the n-type layer and in phantom. FIG. 13 also shows the outer edges of the barrier layer 238 with the areas not exposed shown in phantom as further described below. The remaining layers, vias and inner edges of the barrier layer and mirror layers are not shown for ease of illustration. As mentioned above a portion of the barrier layer 238 may serve as the p-type contact at the topside of the device. In some embodiments a portion of the barrier layer can be exposed for contacting and in the embodiment shown the LED chip layers can be removed above a portion of the barrier layer. In one embodiment the layers above the barrier layer 238 can be etched to the barrier layer 238, thereby forming an exposed barrier layer region 260. The exposed region 260 can be in many different locations and can have many different shapes, with the embodiment shown being at a corner of the LED chip 230.

Exposing the barrier layer in this manner provides advantages such as ease of contacting, but can also present the danger of moisture or contaminants entering the LED layers along the surfaces or edges in the exposed region 260. This moisture or contaminants can negatively impact the lifetime and reliability of an LED chip. To help reduce this danger, steps or transitions can be included as part of the barrier layer that can inhibit or eliminate the amount of moisture or contaminants that can enter the LED chip. The steps or transition can take many different shapes and sizes. Different LED chips can have different numbers of steps or transitions and they can be included in different locations on the barrier layer. In still other embodiments, steps or transitions can be included in other layers.

Figure 14:
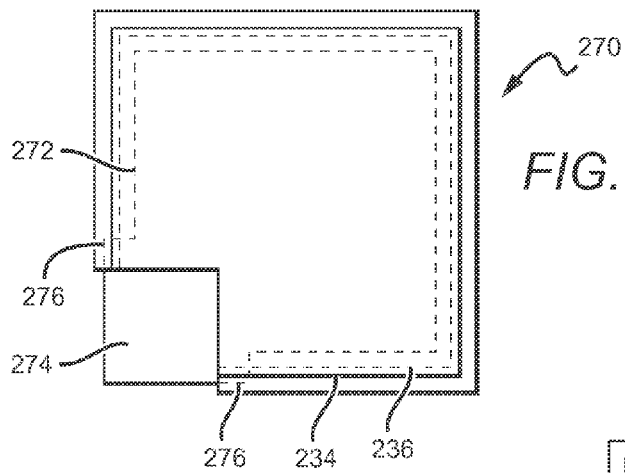
FIG. 14 is a top view of another embodiment of an LED chip according to the present invention.

FIG. 14 shows another embodiment of an LED chip 270 that is similar to the LED chip 230 shown in FIGS. 12 and 13. The LED chip 270 has an n-type layer 234, mirror layer 236 and barrier layer 272, with the other layers and features not shown for ease of illustration. N-type layer 234 and mirror layer 236 are similar to those in LED chip 230 as shown in FIG. 13. Barrier layer 272 is also similar to barrier layer 236 in FIG. 13 and can be contacted through the exposed region 274. The barrier layer 272 has two steps 276 along the edge of the barrier layer 272 that help reduce or eliminate moisture or contaminants that can enter the LED chip 270 along the edge of the barrier layer 272.

For the embodiments shown in both FIGS. 13 and 14 the exposed area of the barrier layer results in a portion of the barrier layer being uncovered such that it may absorb some LED chip light. The amount of exposed barrier can be minimized to minimize the impact of the light absorption, with the periphery of the mirror being free of the barrier layer in the percentages described above. In some embodiments, the exposed portion of the barrier layer can be less than 20% of the overall barrier layer surface. In still other embodiments it can be less than 10%, while in other embodiments it can be less than 5%.

Figure 15:
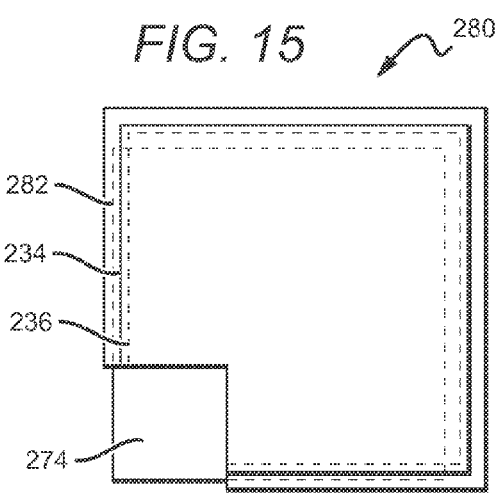
FIG. 15 is a top view of still another embodiment of an LED chip according to the present invention.

The barrier layer can have many different shapes and can be arranged in different locations relative to the other layers of the LED chips according to the present invention. FIG. 15 shows another embodiment of an LED chip 280 according to the present invention that is similar to the LED chip 270, and shows an n-type layer 234 and mirror layer 236. In this embodiment, however, the barrier layer 282 extends beyond that mirror layer 236 along two edges of the mirror layer 236, and the barrier layer can extend beyond the mirror layers in different locations of LED chips. To still have the desirable emission efficiency of the LED chips, the exposed portions of the barrier layers can be relatively thin to reduce the light absorbing surfaces. In some embodiments more than 75% of the exposed edges can be less than 3 microns wide. In other embodiments 90% can have this width, while in other embodiments 100% of the exposed edges can have this width. The exposed width for these percentages can also be different in other embodiments, such as less than 4 microns or less than 2 microns.

The present invention can be used in many different lighting applications, and in particular those using a small sized high output light source. Some of these include, but are not limited to, general illumination, outdoor lighting, flashlights, white LEDs, street lights, architectural lights, home and office lighting, display lighting and backlighting.

Different embodiments of LED chips can be arranged in many different ways and can be used in many different applications according to the present invention. Some of these LED chips can comprise one or more active regions that can be interconnected in different ways, with some embodiments comprising a plurality of active regions on the same submount and interconnected to form high luminous flux emitters operating from relatively high voltages. In some embodiments, the active regions can be coupled together in a linear fashion to provide a light source similar to a filament source. By providing the active regions on a single submount, the space between adjacent LEDs can be minimized. When the active regions emit during operation, the dark spaces between adjacent ones of the active regions can be minimized to give the source the appearance of continual light source.

In some embodiments, the active regions can be formed as a wafer and then mounted (e.g. flip-chip mounted) on the submount. The submount can comprise internal electrical interconnects and insulation layers to allow for serial interconnection of LEDs without the need for external interconnects such as wire bonds. In other embodiments, the wafer with the active regions can comprise internal interconnections and/or insulation layers for interconnection.

In embodiments where the active regions are mounted on the submount in wafer form, the spaces or streets can be formed in the wafer to form the individual active regions. The active region and submount combination can be further processed by dividing or dicing the desired number of active regions. For example, an active region and submount combination with four linearly arranged active regions could be separated from the wafer active region and submount combination. Contacts can then be formed on the LED chip for applying an electrical signal to the LED chip during operation.

In still other embodiments, the desired group of active regions can be separated from the active region wafer and then mounted on the submount. For example, a linear arrangement of four active regions can be separated from the active region wafer and then mounted (e.g. flip-chip mounted) to a submount appropriately sized and arranged to accept the four active regions. In still other embodiments, individual active regions can be mounted on submount.

The monolithic LED chips are described herein with reference to series connections, but it is understood that the active regions can be interconnected in different series and parallel combinations. The different embodiments of the present invention can be arranged in many different ways with many different features. Some embodiments can comprise barrier layers as described above, with the barrier layer in some embodiments not extending, or minimally extending, beyond the edge of the mirror as described above in certain areas (e.g. below the emission area of the active region). This can help minimize the amount of light absorbed by the barrier layer, thereby increasing overall emission efficiency.

FIG. 16 is a sectional view of one embodiment of a monolithic LED chip 300 according to the present invention. The LED chip 300 can comprise many different features and layers, most of which are not shown for ease of description. The LED chip 300 comprises a plurality of emitting active regions 302 mounted on submount 304. As mentioned above, in some embodiments the active regions can be mounted on the submount in wafer form or portion of the wafer comprising a group of active regions. In still other embodiments, individual active regions can be mounted to the submount 304. In embodiments where an active region wafer or portion of an active region wafer is mounted to the submount 304, the individual active regions can be separated on the submount 304 by known methods such as etching, cutting or dicing. The side surfaces of the resulting active regions can be angled or shaped, and the distance between adjacent active regions is relatively small. In some embodiments, the distance can be 15 microns ($\mu$) or less or less, while in other embodiments it can be 10$\mu$ or less. In still other embodiments, it can be 5$\mu$ or less, and in other embodiment is can be up or less. Some embodiments can also have a space in the range of 1 to 0.05$\mu$. The space can have different percentage of a width of the active regions with some embodiments having a space that is approximately 15% or less of an active region width, while in other embodiments the space can be approximately 10% or less. In still other embodiments the space can be 5% or less of a width, while other embodiments can have a space that is 2.5% or less of a width. Other embodiments can have a space that is 1.5% or less of a width, with some embodiments having a space that is approximately 1.1% of an active region width. These are only some of the ratios and dimensions that can be used in different embodiments according to the present invention.

The submount 304 can also contain integral and internal electrical interconnects 306 arranged to connect the active regions in series. In some embodiments this can comprise a number of vias and electrically conductive paths or layers coupled together in different ways to provide the desired interconnect scheme. The LED chip 300 can also comprise first and second contact pads 308, 310 for applying an electrical signal to the LED chip 300. The first contact 308 can be either a p-contact or an n-contact, with the second contact 310 being the other of the p-contact and n-contact. In some embodiments, the LED chip 300 also comprise contact interconnects 312 for conducting an electrical signal from the first contact pad 308 to the first of the active regions 302, and for conducting an electrical signal from the last of the active regions 302 to the second contact pad 310.

The arrangement allows for an electrical signal to be applied to the LED chip 300 across the first and second contacts 308, 310. The LED chip 300 can also comprise one or more insulating layers 314 to electrically insulate the active regions 302 and interconnects 306, 312 from any conductive elements below the insulating layer 314. In some embodiments, other insulating layers can be included such that at least a portion of the interconnects 306, 312 are surrounded by insulating materials, with those portions buried in the insulating material. The LED chip 300 can also comprise a substrate 316 and bonding layer 318 for adhesion between the substrate 316 and the layers above the substrate 316.

The LED chip 300 can operate from an electrical signal that is approximately equal to the sum of the junction voltages of the active regions 302. Other factors contribute to the operating voltage, with the voltage generally scaling with the number of junctions. In some embodiments each of the active regions 302 can have a junction voltage of approximately 3V, such that the electrical signal applied to the active regions can be approximately equal to 3 times the number of active regions. In some embodiments, the LED chip can have four active regions so that the LED chip operates from an approximate 12V electrical signal.

The LED chips according to the present invention can be fabricated in many different ways according to the present invention. FIG. 17 shows the LED chip 300 at an intermediate manufacturing step where in some embodiments the active regions can be formed separately from the submount 304, with the submount having buried interconnects 306, 312, insulating layer(s) 314 and contacts 308, 310. The active regions 302 can then be mounted to the submount in contact with interconnects 306, 312. The active regions 302 can then have spaces formed between adjacent ones of the active regions, with the spaces formed either before or after mounting on the submount 304.

Figure 18:
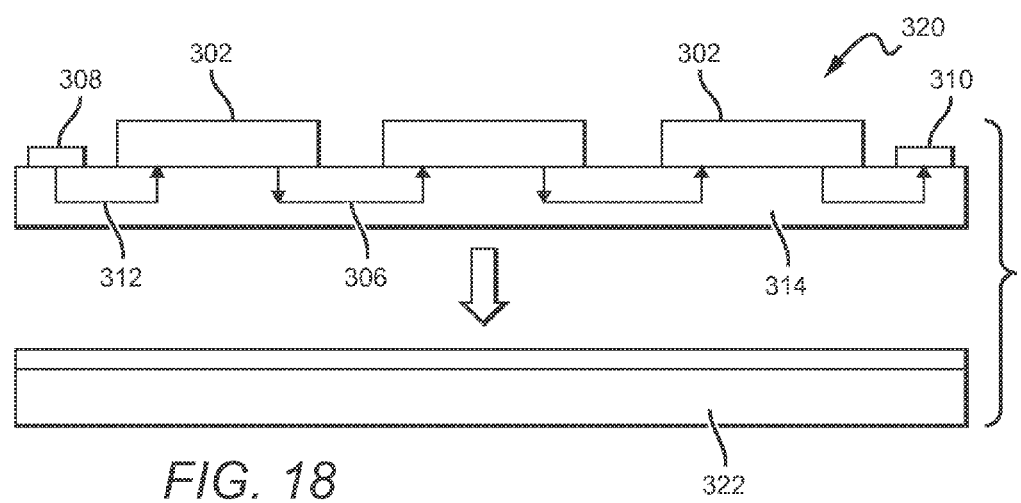
FIG. 18 is a sectional view of another LED chip according to the present invention at an intermediate manufacturing step.
Figure 19:
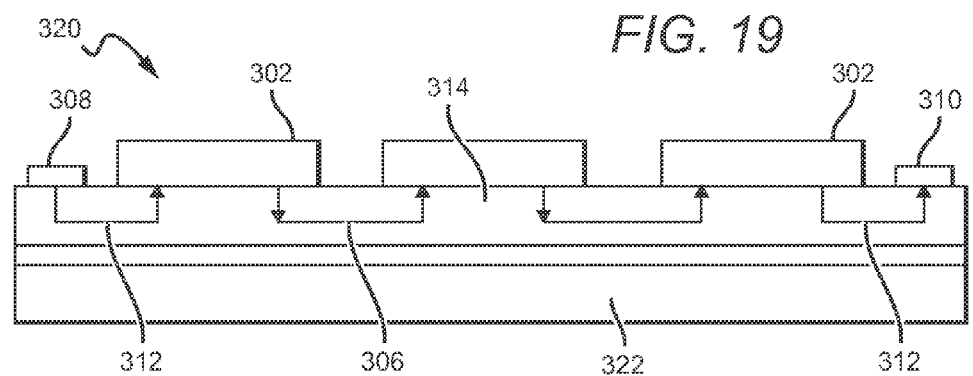
FIG. 19 is another sectional view of the LED chip shown in FIG. 18.

FIGS. 18 and 19 show another embodiment of a monolithic LED chip 320 having many of the same features as LED chip 300. For these same features, the same reference numbers are used with the understanding that the description above applies to the features in this embodiment. In this embodiment, the active regions 302 are formed with interconnects 306, 312, insulating layer(s) 314 and contacts 308, 310. Like the embodiment above, at least a portion of the interconnects 306, 312 are buried in or surrounded by insulating material to electrically isolate them from other features in the LED chip 320. This structure can then mounted to a separate substrate and bonding layer structure 322 to form the monolithic LED chips 320 with serially interconnected active regions.

Figure 20:
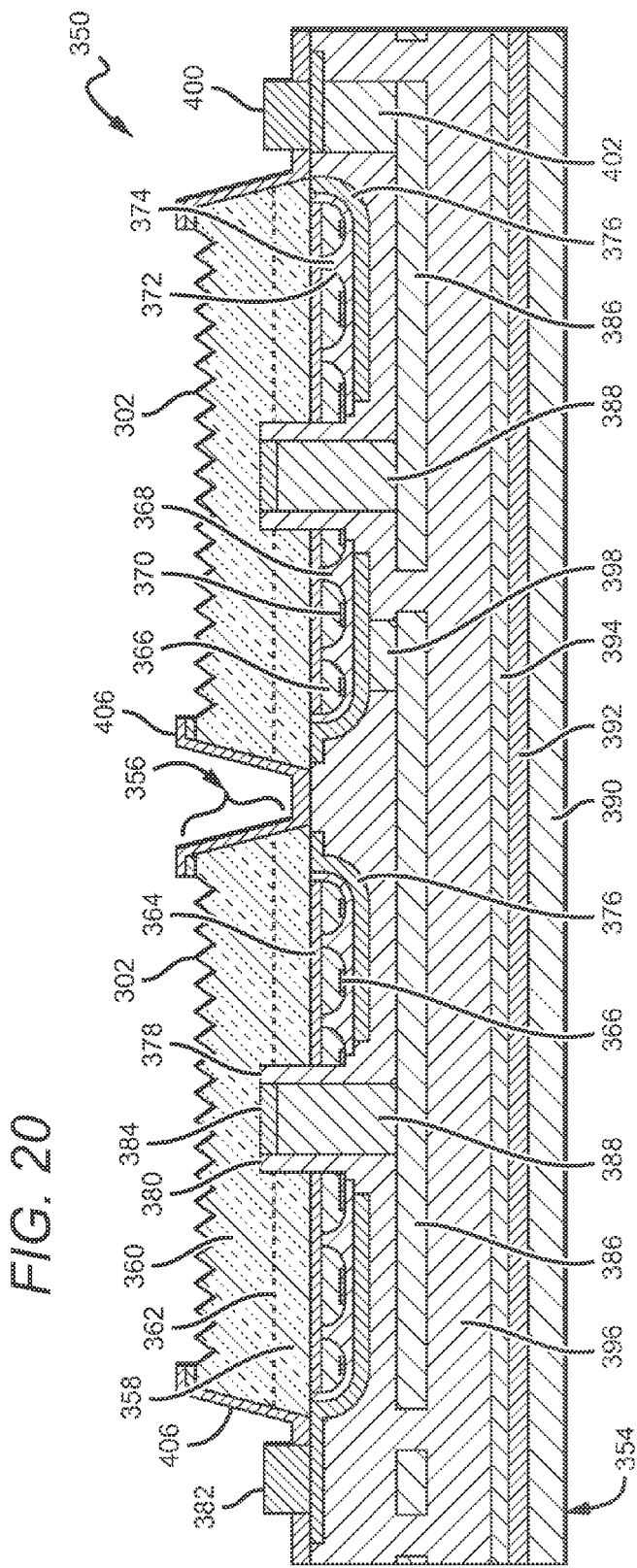
FIG. 20 is a sectional view of another embodiment of a monolithic LED chip according to the present invention.

Different LED chip embodiments according to the present invention can have many different features and layers of different materials arranged in different ways. FIG. 20 shows another embodiment of a monolithic LED chip 350 according to the present invention comprising two interconnected active regions 352, but it understood that other monolithic LED chips can comprise many different numbers of interconnected active regions. The active regions 352 can have lateral geometry and can be flip-chip mounted on a submount 354 that can have many different features and can be made of many different layers and materials.

The active regions 352 can be made from many different material systems, with the embodiment shown being from a Group-III nitride material system. The active regions 352 can comprise an active structure 356, for example, a GaN active structure having a p-type layer 358, n-type layer 360 and an active layer 362. Some embodiments of the active regions can also comprise a growth substrate that can be many different materials such as silicon carbide or sapphire, and can be shaped or textured to enhance light extraction such as the substrate shaping utilized in commercially available DA line of LEDs from Cree, Inc. In the embodiment shown, the substrate can be removed and the n-type layer 360 can be shaped or textured to enhance light extraction.

The active regions 352 can also comprises a current spreading layer 364 that is on the p-type layer 358 such that when the active regions 352 are mounted on the submount 354, the LED current spreading layer 364 is between the active structure 356 and the submount 354. The current spreading layer 364 can comprise many different materials and is typically a transparent conductive oxide such as indium tin oxide (ITO) or a metal such as platinum (Pt), although other materials can also be used. The current spreading layer 364 can have many different thicknesses, with the present invention having a thickness small enough to minimize absorption of light from the active structure that passes through the current spreading layer. Some embodiments of the current spreading layer 364 comprise ITO having thicknesses less than 1000 angstroms (Å), while other embodiments can have a thickness less than 700 Å. Still other embodiments can have a thickness less than 500 Å. Still other embodiments can have a thickness in the range of 50 to 300 Å, with some of these embodiments having current spreading layer 364 with a thickness of approximately 200 Å. The current spreading layer 364 as well as the reflective layers described below can be deposited using known methods. It is understood that in embodiments where current spreading is not a concern, the active regions can be provided without a current spreading layer.

A low index of refraction (IR) reflective layer 366 can be arranged on the current spreading layer 364, with current spreading layer 364 between the reflective layer 366 and active structure 356. The reflective layer 366 can comprise many different materials and preferably comprises a material that presents an IR step between the materials comprising the active structure 356. Stated differently, the reflective layer 366 should have an IR that is smaller than the active structure to promote TIR of active structure light emitting toward the reflective layer 366. Light that experiences TIR can be reflected without experiencing absorption or loss, and TIR allows for the efficient reflection of active structure light so that it can contribute to useful or desired active region emission. This type of reflective layer can be an improvement over devices that rely on metal layers to reflect light where the light can experience loss with each reflection. This can reduce the overall LED chip emission efficiency.

Many different materials can be used for the reflective layer 366, with some having an IR less than 2.3, while other embodiments can have an IR less than 2.15. In still other embodiments the IR can be less than 2.0. In some embodiments the reflective layer 366 can comprise a dielectric, with some embodiments comprising $SiO_2$. It is understood that other dielectric materials can be used such as SiN, Si, Ge, MgOx, MgNx, ZnO, SiNx, SiOx, AlN, and alloys or combinations thereof.

Some Group III nitride materials such as GaN can have an IR of approximately 2.4, and $SiO_2$ has an IR of approximately 1.46. Embodiments with an active LED structure 356 comprising GaN and that also comprises a $SiO_2$ reflective layer, can have a sufficient IR step between the two to allow for efficient TIR of light at the junction between the two. The reflective layer 366 can have different thicknesses depending on the type of material, with some embodiments having a thickness of at least 0.2 microns (μm). In some of these embodiments it can have a thickness in the range of 0.2 to 0.7 μm, while in some of these embodiments it can be approximately 0.5 μm thick.

As light experiences TIR at the junction with the reflective layer 366 an evanescent wave with exponentially decaying intensity can extend into the reflective layer 366. This wave is most intense within approximately one third of the light wavelength from the junction (about 0.3 um for 450 nm light in SiO2). If the reflective layer 366 is too thin, such that significant intensity remains in the evanescent wave at the interface between the first reflective layer 366 and the second reflective layer 368, a portion of the light can reach the second reflective layer 368. This in turn can reduce the TIR reflection at the first interface. For this reason, in some embodiments the reflective layer 366 should have a thickness of at least 0.3 um.

A metal reflective layer (i.e. second reflective layer) 368 and adhesion layer 370 are included on the reflective layer 366, with the adhesion layer 370 sandwiched between and providing adhesion between the metal layer 368 and reflective layer 366. The metal layer 368 is arranged to reflect light that does not experience TIR at the junction with the reflective layer 366 and passes through the reflective layer 366. The metal layer 368 can comprise many different materials such as Ag, Au, Al, or combinations thereof, with the present invention being Ag.

Many different materials can be used for the adhesion layer 370, such as ITO, TiO, TiON, TiO$_2$, TaO, TaON, Ta$_2$O$_5$, AlO or combinations thereof, with a preferred material being TiON. The adhesion layer 370 can have many different thicknesses from just a few A to thousands of A. In some embodiments it can be less than 100 Å, while in other embodiments it can be less than 50 Å. In some of these embodiments it can be approximately 20 Å thick. The thickness of the adhesion layer 370 and the material used should minimize the absorption of light passing to minimize losses of light reflecting off the metal layer 368.

The active regions 352 can further comprise reflective layer holes 372 that can pass through the adhesion layer 370 and the reflective layer 366, to the current spreading layer 364. The holes 372 can then be filled when the metal layer 368 is deposited with the metal layer material forming vias 374 to the current spreading layer 364. The vias 374 can provide a conductive path through the reflective layer 368, between the p-contact and the current spreading layer 364.

The holes 372 can be formed using many known processes such as conventional etching processes or mechanical processes such as micro drilling. The holes 372 can have many different shapes and sizes, with the holes 372 in the embodiment shown having angled or curved side surfaces and a circular cross-section with a diameter of less than 20 μm. In some embodiments, the holes 372 can have a diameter of approximately 8 μm, with others having a diameter down to 1 μm. Adjacent holes 372 can be less than 100 μm apart, with the embodiment shown having a spacing of 30 μm spacing from edge to edge. In still other embodiments, the holes can have a spacing of as low as 10 μm or less. It is understood that the holes 372 (and resulting vias) can have cross-section with different shapes such as square, rectangular, oval, hexagon, pentagon, etc. In other embodiments the holes are not uniform size and shapes and there can be different or non-uniform spaces between adjacent holes.

In other embodiments different structures can be used to provide a conductive path between the p-contact and the current spreading layer. Instead of holes an interconnected grid can be formed through the reflective layer 368, with a conductive material then being deposited in the grid to form the conductive path through the composite layer. The grid can take many different forms, with portions of the grid interconnecting at different angles in different embodiments. An electrical signal applied to the grid can spread throughout and along the interconnected portions. It is further understood that in different embodiments a grid can be used in combination with holes, while other embodiments can provide other conductive paths. In some embodiments one or more conductive paths can run outside the LED chip's active layer such as along a side surface of the LED chip.

The active regions 352 can also comprise a barrier layer 376 on the metal layer 368 to prevent migration of the metal layer material to other layers. Preventing this migration helps the LED chips 352 maintain efficient operation through their lifetime.

An active structure hole 378 can be included passing through the barrier layer 376, metal layer 368, adhesion layer 370, reflective layer 366, and p-type layer 358, to expose the n-type layer 360. A passivation layer 380 is included on the barrier layer 376 and the side surfaces of the active structure hole 378. The passivation layer 380 protects and provides electrical insulation between the contacts and the layers below as described in more detail below. The passivation layer 380 can comprise many different materials, such as a dielectric material. In the embodiment shown, the barrier layer 376 does not extend beyond the edge of the metal layer 368 around the active structure hole 378. This reduces the amount of light absorbing barrier layer material that would absorb LED light, thereby increasing the overall emission efficiency of the LED chip 350.

For one of the active regions 352, the barrier layer 376 can extend beyond the edge of the active region 352 and can be exposed at a mesa on the passivation layer 380 adjacent the LED. This exposed portion can be used for contacting the serially interconnected active regions 352. In some embodiments, a p-contact pad 382 can be deposited on the passivation barrier layer 376, with the p-contact 382 providing an electrical signal that can pass to the p-type layer 358. An electrical signal applied to the p-contact passes through the barrier layer 376, the metal layer 368, the vias 374, and to the current spreading layer 364 through which it is spread to the p-type layer 358.

An n-contact 384 can be formed on the n-type layer 360 and a conductive n-type layer vias 388 can be formed through the passivation layer 380 and between the n-type contact 384 and an interconnection metal layer 386. As more fully described below, the interconnection metal layer 386 is arranged to conduct an electrical signal between adjacent ones of the LED chips 352 to interconnect them in series. The interconnection metal layer 386 can have breaks along its length to facilitate this serial interconnection and can be made of many electrically conductive materials, such as those described herein. As described above, the metal layer 386 can be formed as part of the submount 354 using known methods, are can be formed with the active regions. An electrical signal at the n-type layer 360 conducts into the n-contact 384, into its corresponding via 388, and to the interconnection metal layer 386. The interconnection layer can have many different shapes and thicknesses. In some embodiments it can comprise a substantially continuous layer with breaks, while in other embodiment it can comprise conductive traces.

The p-contact 382, the n-contact 384, interconnection metal layer 386, and n-type vias 388 can comprise many different materials such as Au, copper (Cu) nickel (Ni), indium (In), aluminum (Al), silver (Ag), tin (Sn), platinum (Pt) or combinations thereof. In still other embodiments they can comprise conducting oxides and transparent conducting oxides such as ITO, nickel oxide, zinc oxide, cadmium tin oxide, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, LaCuOS, $CuGaO_2$ and $SrCu_2O_2$. The choice of material used can depend on the location of these features as well as the desired electrical characteristics such as transparency, junction resistivity and sheet resistance.

As mentioned above, the growth substrate for active regions 352 has been removed, and the top surface of the n-type layer is textured for light extraction. The active regions 352 are flip-chip mounted to a substrate 390 that can provide mechanical stability. A bond metal layer 392 and blanket mirror 394 between the substrate 390 and the active structure 356. The substrate 390 can be made of many different materials, with a suitable material being silicon. The blanket mirror 384 can be made of many different materials, with a suitable material being Al. The blanket mirror 384 helps to reflect LED light that escapes reflection by the reflective layer 366 and the metal layer 368, such as light that passes through the active structure hole 378.

The reflective layer 366 and the metal layer 368 are arranged between the active region's active structure 356 and the substrate 390 so that light emitted by the active structure 356 toward the substrate 390 can be reflected back to contribute to useful LED light emission. This reduces the amount of light that can be absorbed by structures such as the substrate 390, with the embodiments according to present invention promoting reflection by TIR instead of reflection off metal layers, to further reduce light loss due to absorption.

The submount 354 also comprises a isolation layer 396 arranged on the blanket mirror 394 such that it provides electrical isolation between the blanket mirror 394 and all elements above the blanket mirror 394, such as the interconnection metal 386. This isolation allows for electrical signals to be conducted between adjacent ones of the active regions without being shorted to the blanket mirror 394 or other features below the blanket mirror 394. The isolation layer 396 can be made of many different materials, with the preferred material being made of an electrically insulating material such as a dielectric. The combination of the isolation layer 396 and passivation layer 380 results in the interconnection metal 386 being buried and/or surrounded by electrically insulating materials. This internal isolation of the electrical paths within the LED chip 350 provides for reliable and efficient interconnection and operation of the active regions 352.

As mentioned above, an electrical signal is applied to the p-type layer 358 in the first of the active regions connected in series, at the p-type contact pad 382. For each of the subsequent active regions 352 connected in series, a p-type conductive vias 398 is included between the interconnection metal layer 386 and the barrier layer 376 of the active region. The electrical signal at the vias 398 passes through the barrier layer 376 and to the current spreading layer 364 and to the p-type layer 358.

At the last of the serial connected actives regions, and n-contact pad 400 is formed on a mesa on the passivation layer 380 adjacent the active region 352. An n-pad via 402 is formed between the n-contact pad 400 and the interconnection metal layer to conduct a signal from the n-type layer 360 in the last of the LED chips 352 to the n-contact pad 400. The emitter 350 can also comprise a passivation or protection layer 406 on the side surfaces of the active structure 356 and covering the top surface of the submount 354 around the p-contact pad 382 and the n-contact pad 400.

Figure 21:
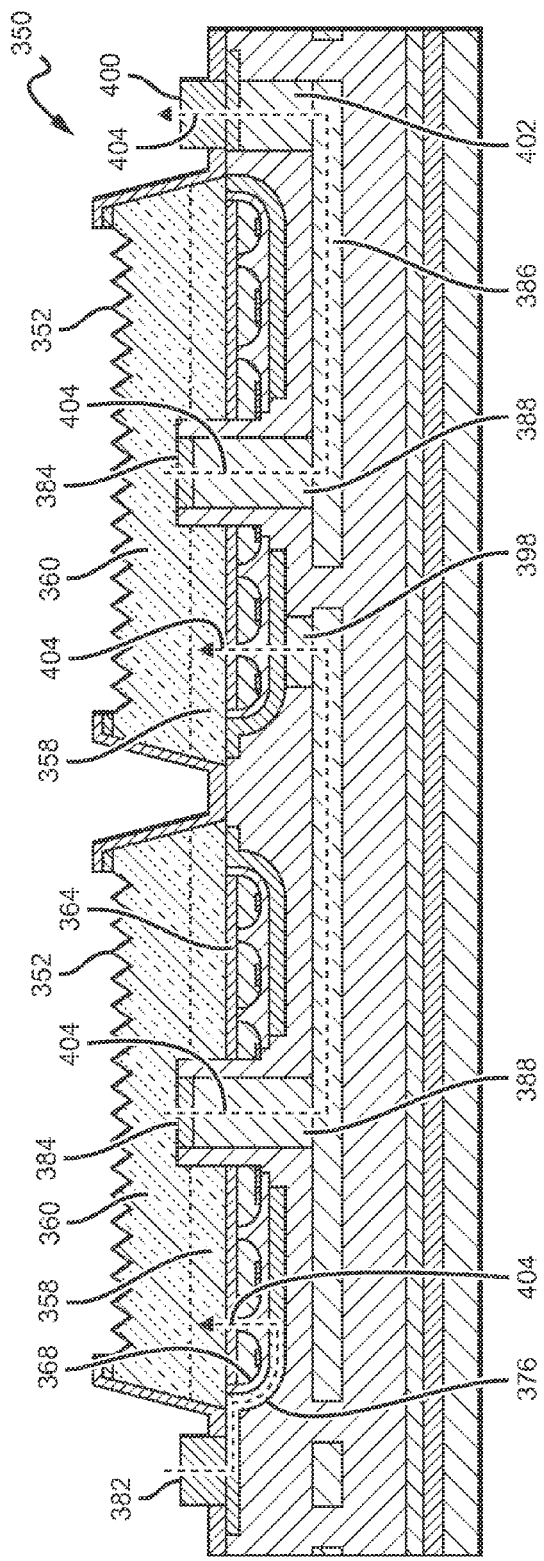
FIG. 21 is a sectional view of the LED chip in FIG. 20 showing flow of an electrical signal.

FIG. 21 shows the LED chip 350 during operation with an electrical signal following a path through the emitter 350 as shown by arrows 404. An electrical signal is applied to the p-contact pad 382 and is conducted through the barrier layer 376, metal layer 368, and current spreading layer 364, to the p-type layer 358. The signal then passes through to the n-type layer 360 where it passes through to the n-contact 384 and the n-type vias 388. The signal then conducts along the interconnection metal layer where it passes into the first of the p-type vias 398. The signal is then conducted to the p-type layer 358 in the second active region 352, where it passes into the n-type layer 360, n-contact 384 and n-type vias 388. Although only two active regions 352 are shown, it is understood that emitters according to the present invention can have many more, and in those embodiments, the signal then passes on to the next of the active regions 352 connected in series and this continues until the last of the active regions 352. At the last of the active regions 352, the electrical signal at the n-type vias 388 passes into the interconnection metal layer 386 and to the n-pad vias 402, where it is conducted to the n-contact pad 400. This type of interconnection and current flow allows for a high voltage LED chip light source formed monolithically on a submount.

The LED chip 350 shown in FIGS. 20 and 21 comprises a lateral geometry in that electrical signals can be applied to the LED chip 350 at p-contact 382 and n-contact pad 400 accessible from the top surface of the LED chip. In other embodiments the LED chip 350 can comprise different contact geometries and arrangements. FIGS. 22 and 23 show another embodiment of an LED chip 450 according to the present invention having many of the same features as the LED chip 350, but having internal conductive features to provide a vertical geometry chip. The LED chip does not have an n-contact pad on its top surface, but instead a substrate via 452 that passes from the interconnection metal layer 386, down and through the insulation layer 396, to the layers below. In embodiments where the substrate 390, bond metal layer 392, and blanket mirror 394 comprise electrically conductive materials, the substrate vias 452 can extend to the blanket mirror 452. An electrical signal applied to the substrate 390 would conduct to the substrate via 452. In embodiments where one of these layers does not have the desired electrical conductivity, the can pass further through the different layers. For example, if the substrate 390 is not electrically conductive, the substrate vias 452 can pass through the substrate 390 so that it is accessible at the bottom of the LED chip 450. One or more contact layers or pads (not shown) can also be included on the bottom of the LED for making electrical contact.

Referring now to FIG. 23, an electrical signal passes through the LED chip 450 as shown by arrows 454, and has much the same path as that shown for LED chip 350 in FIG. 21. An electrical signal is applied to the p-contact pad 382 and is conducted through the barrier layer 376, metal layer 368, and current spreading layer 364, to the p-type layer 358. The signal then passes through to the n-type layer 360 where it passes through to the n-contact 384 and the n-type vias 388. The signal then conducts along the interconnection metal layer 386 where it passes into the first of the p-type vias 398. The signal is then conducted to the p-type layer 358 in the second active region 352, where it passes into the n-type layer 360, n-contact 384 and n-type vias 388. The signal then passes on to the next of the active regions 352 connected in series and this continues until the last of the active regions 352. At the last of the active regions 352, the electrical signal at the n-type vias 388 passes into the interconnection metal layer 386 and to the substrate vias where it passes to the substrate 390. This type of an electrical signal to be applied to the LED chip at the top surface (p-contact pad 382) and the bottom surface (substrate 390) in a vertical geometry type arrangement.

It is understood that the above are only examples of different interconnection and contacting arrangements according to the present invention. Other embodiments can have different internal interconnection arrangements and other embodiment can be arranged so that an electrical signal is applied to the LED chip at the bottom surface. It is also understood that all of the embodiments described above can also be included in vertical geometry type LED packages.

Figure 24:
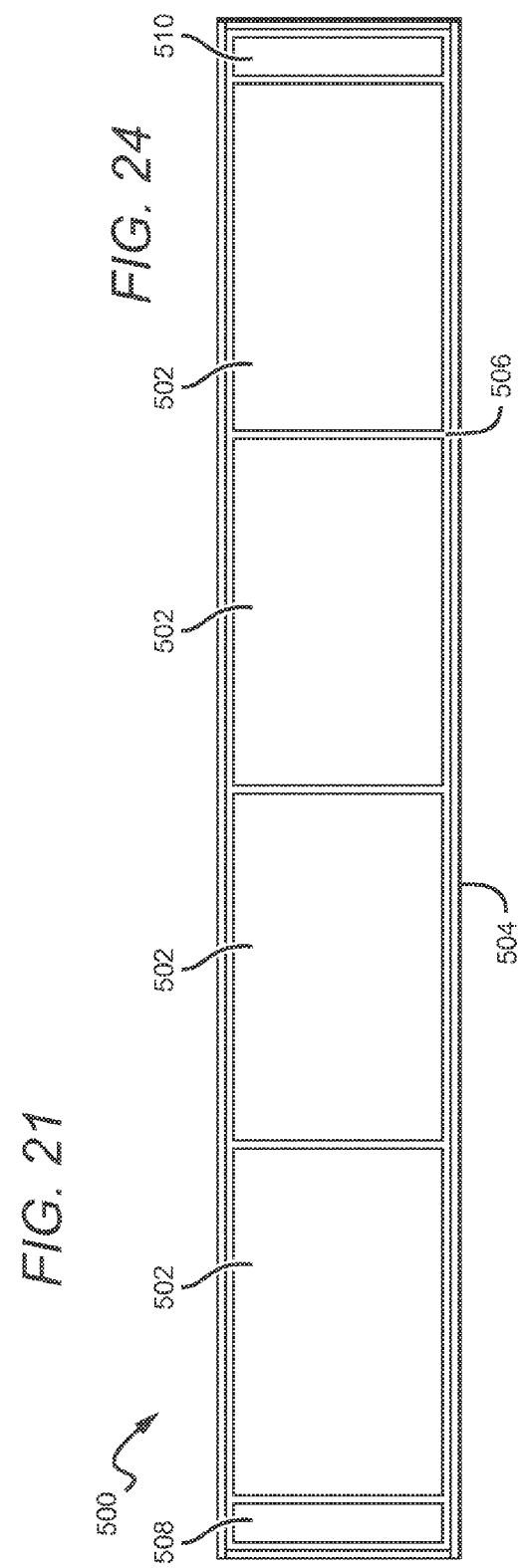
FIG. 24 is a plan view of an monolithic emitter according to the present invention.

The monolithic LED chips can be used in many different applications and can be arranged in many different ways. FIG. 24 shows one embodiment of a monolithic LED chip 500 according to the present invention that comprises four active regions 502 arranged on a single submount 504. The LED chip 500 can have many different shapes and sizes, with the emitter shown having a rectangular shape. Each of the active regions 502 can also have a generally rectangular footprint, with a small space 506 formed between adjacent ones of the active regions 502. The space 506 is shown as being in a straight line, but it is understood that the space can have curves or can be squiggly. The space 506 can be formed using known methods such as different etch or cut methods. A p-contact pad 508 is arranged at one end of the emitter 500 and the n-contact pad 510 is arranged at the opposite end. A signal applied to the p-contact pad conducts through the device to the n-contact as described above.

The different embodiments of the devices described herein can have many advantages. The rectangular embodiment can be sized to mimic the emission of a filament in a convention light source. By interconnecting the active regions in series, a high voltage light source can be provided that is compatible with many conventional lighting applications. In the embodiment shown, the emitter 450 has four active regions each having a 3 volt junction. This results in the LED chip 450 comprising a 12 volt light source. Different numbers of LEDs can result in emitters that operate from different voltages. For example, a similarly arranged emitter with six active regions comprises a 24 volt light source.

By providing a monolithic device formed on a single substrate instead of discrete LED chips or packages on a submount, the space between adjacent active regions can be minimized. This minimizes or eliminates the undesirable dark spaces between adjacent ones of the active regions, giving the emitter the appearance of a continuous filament.

Figure 25:
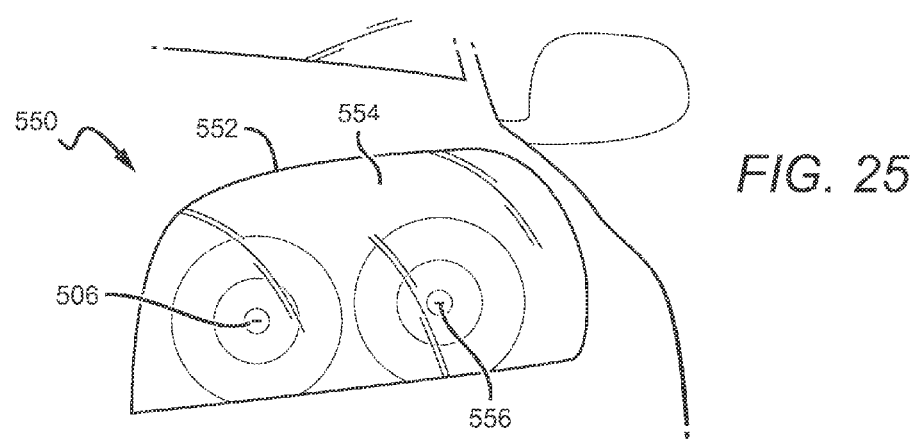
FIG. 25 is a front view of one embodiment of a car headlight according to the present invention.

The monolithic emitters can be used in many different lighting fixtures, including but not limited to lamps, bulbs, flashlight, streetlights, automobile headlights, etc. FIG. 25 shows one embodiment of a car headlight 550 according to the present invention having a housing 552, with an opening having a light transmitting cover/lens 554. The headlight has one or more monolithic LED chips 556 mounted in the housing so that light from LED chips emits out the housing opening through the lens/cover. Many different monolithic LED chips can be used with many different numbers of active regions, with some embodiments using a four active region monolithic LED chip operating from a 12v electrical signal For high voltage LED chips that connect multiple p-n junctions together on a single chip as described above (e.g. through wafer fabrication processing), the integral nature of the interconnection metal layers can present certain problems during operation. For example, when the LED chips are used in high power applications they can experience certain reliability problems. In some embodiments, the interconnection metal layers 386 in a high voltage chip function as current carrying layers while also being a reflective layer. The layer 386 should comprise a good current conductor that is also reflective so that it does not absorb LED light. Different materials can comprise both these properties, such as Al or Ag. One potential problem is that some of these interconnection metal layers made of these materials can experience electromigration under high current operation that can cause degradation in performance and can ultimately lead to failure of the device. In some instances this electromigration can cause voids in the interconnecting layer that can degrade performance of the LED chip. These voids that can then result in current conducting hot spots, which can accelerate electromigration. Continued electromigration can eventually lead to open circuits in the interconnect layer and failure of the LED chip.

To address this issue, some embodiments according to the present invention can have layer structures or interconnection metal layers made of certain materials, with both helping to reduce or eliminate this interconnection metal layer electromigration. This can result in more reliable devices where failures under high power operation are mitigated. These LED chips can experience longer lifetimes and improved performance throughout their lifetime.

The present invention can be applied to many different LED chips operating from different power densities. In some embodiments, the LED chips can operate with power density up to 3 watts per square millimeter (W/mm$^2$). Other embodiments can operate with even higher power density up to 10 W/mm$^2$, while still other embodiments can operate with power density in excess of 10 W/mm$^2$.

Operating at higher power density can lead to devices operating at higher temperature, and there can also be other causes of high temperature operation such as environmental conditions. The embodiments according to the present invention can reliably operate at high temperature, with some embodiments capable of reliable operation at junction temperatures up to 85° C. Other embodiments according to the present invention can reliably operate at junction temperatures up to 125° C., while other embodiments can reliably operate at junction temperatures up to 200° C. Still other embodiments can reliably operate at junction temperatures high than 200° C.

The present invention can also be used in many different chips sizes. Chip size ranges can be defined in terms of the area of the chip and some embodiments can have chip area of up to 1 mm$^2$. Other embodiments can have chip area up to 6 mm$^2$, while other embodiments can have larger chip areas.

Figure 26:
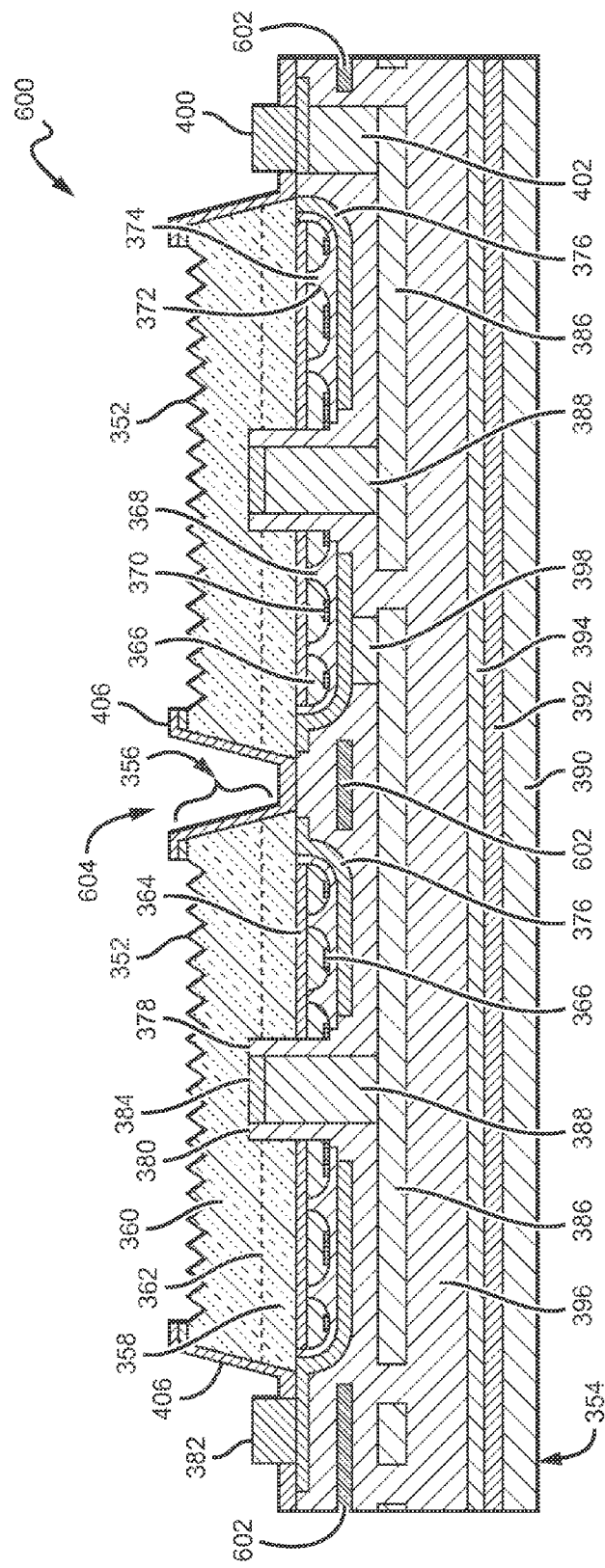
FIG. 26 is a sectional view of another embodiment of a monolithic LED chip according to the present invention.

FIG. 26 shows another embodiment of an LED chip 600 according to the present invention having an interconnection metal layer arranged to reduce or eliminate high power performance degradation and failure due to electromigration. In this embodiment, the interconnection metal layer's functions of reflector and electrical conductor can be separated into different layers. This allows for an interconnection metal layer that efficiently conducts electrical signals, but also has high resistance to electromigration. This high resistance to electromigration results in little to no electromigration and reduces or eliminates the electromigration related failures described above. Some conductive materials with high resistance to electromigration may have lower reflectivity, which can cause these layers to absorb LED chip light and lower overall LED chip emission efficiency. To address this, these LED chip embodiments can also have reflective/reflector layers or features that are separate from the conductive interconnect layer and are arranged to reflect light that might otherwise be absorbed by the less reflective interconnection metal layer. This reflected light can contribute to over LED chip emission to provide for efficient overall LED chip emission efficiency.

LED chip 600 has many of the same or similar features and the LED chips shown in FIGS. 20-23 and described above, and for these features the same reference numbers are used. It is understood that these same or similar features can be arranged in the same way and can comprise the same materials with the same or similar dimensions as those described above. The LED chip 600 comprises active regions 352 on a submount 354, with the active regions comprising active structures 356 with p-type layer 358, n-type layer 360 and active layer 362. A current spreading layer (or p-contact layer) 364 is included on the p-type layer, and a first low index of refraction reflective layer 366 is included on the current spreading layer 364. A second reflective layer 368 in included on the first reflective layer 366, with an adhesion layer 370 between the two reflective layers. Reflective layer holes 372 are included through the first reflective layer with vias 374 formed through the first from reflective layer 366 from the second reflective layer material. An electrical signal carried by the second reflective layer 368 passes through the first reflective layer 366 along vias 374 and to the current spreading layer 364.

A barrier layer 376 can be included on the second reflective layer 368 to help prevent electromigration of the second reflective layer material to other layers. This also helps maintain reliable and efficient operation of the LED chip 600. An active structure hole 378 can be included passing through the barrier layer 376, metal layer 368, adhesion layer 370, reflective layer 366, and p-type layer 358, to expose the n-type layer 360. A passivation layer 380 is included on the barrier layer 376 and the side surfaces of the active structure hole 378. In this embodiment, the barrier layer 376 can extend beyond the edge of the active region 352 and can be exposed at a mesa on the passivation layer 380 for a p-contact pad 382 to be deposited on the passivation barrier layer 376. An n-contact 384 can be formed on the n-type layer 360 in the active structure holes 378 and a conductive n-type layer vias 388 can be formed through the passivation layer 380 and between the n-type contact 384 and an interconnecting metal layer 386. An n-contact pad 400 is included in electrical contact with the interconnecting metal layer 386, and in the embodiment shown is included on a via plug that is on or in electrical contact with the interconnecting metal layer 386. All of the above layers can be on an insulation layer 396, with some LED chips according to the present invention also having some or all of the additional layers described above.

As mentioned above, the reflective and conducting characteristics or functions of the interconnection metal layer 386 are provided with different layers or materials. In the embodiment shown, the interconnecting metal layer 386 retains its conductivity characteristics, but can be made of a material that resists electromigration. These materials can be less reflective and can absorb LED light emitting toward the interconnection metal layer 386. This can ultimately result in reduced emission efficiency for the LED chip 600. To address this, additional layers or features can be included that provide the reflectivity characteristics or functions in areas where the interconnecting metal layer 386 is exposed to light from the LED chip's active regions 352. This prevents the light reaching the interconnecting metal layer where a portion of it can be absorbed, and also reflects the light so it can contribute to use emission from the LED chip.

In different embodiments additional reflective layers can be included in many different locations in the LED chip 600. In the embodiment shown a third reflective layer 602 can be included that is embedded in the LED chip 600 in areas below the active regions 352 and above the interconnection metal layer 386. In the embodiment shown, the third reflective layer 602 can be below the streets 604, and can be included around the outside edges of the active regions 352. These edge portions of the third reflective layer 602 can be in the layers below the active regions 352 and extending out from beyond the edges of the active regions 352. At least a portion can be below and extending beyond the area covered by the p-contact pad 382, with another portion of the second reflector layer 506 extending out from the edge of the n-contact pad 400.

The third reflective layer 602 can be in different locations in the layer structure of the LED chip 600. In the embodiment shown the third reflective layer 602 can be embedded in the passivation layer 380 and is electrically isolated from other layers of the LED chip 600. That is, the third reflective layer 602 does not carry electrical signals during operation of the LED chip 600, but are instead provided only for the reflective characteristics. The reflector layers are located in the areas where the less reflective interconnection metal layer 386 would be visible or where LED light might otherwise be able to reach the interconnection metal layer 386 where some of it may be absorbed. Portions of the third reflective layer 602 that are below the street 604 reflect LED light that would otherwise continue on to the interconnection metal layer 386 between the active regions 352. Portions of the third reflective layer 602 around the edge of the active regions 352 similarly reflect light that would otherwise reach the interconnecting metal layer 386 beyond the edges of the active regions 352.

The third reflective layer 602 can be made of many different reflective materials, with some embodiments comprising reflective metals such as Ag, Au, Al or combinations thereof in mixture/alloy or in a stack of different layers of different materials. In some embodiments the third reflective layer can comprise Al or can comprise Al with an adhesion material such as Ti with third reflective layer 602 comprising and Al/Ti stack. The third reflective layer 602 can also be deposited using known methods, as described above. In other embodiments, the third reflective layer 602 can comprise non-metallic materials, such as dielectric materials that can be arranged as one or multiply layered reflectors such as distributed Bragg reflectors (DBRs).

When used in conjunction with the third reflective layer 602, the interconnection metal layer 386 can comprise any of the many materials described above, either alone or in combination. In this embodiment, less reflective materials can be used that resist electromigration, with the preferred materials comprising broad band reflectors. In some embodiments, the conductive interconnection metal layer 386 can comprise different materials that can provide for good adhesion to surrounding layers, barriers to surrounding layers and for conduction of an electrical signal.

In some embodiments the interconnection metal layer 386 can comprise an adhesion and/or diffusion layers sandwiching a current conduction layer. These arrangements are particularly applicable to high current LED chip operation with the interconnection metal layer 386 carry elevated current levels. The barrier and or adhesion layers can comprise materials such as Ti, TiW and Pt either alone or in combination. In some embodiments a stack of layer having different materials can serve as an adhesion/barrier layer with the stack in one embodiment comprising alternating layers of materials. In some embodiments according to the present invention the adhesion/barrier stack can comprise TiW_Pt_TiW_Pt_TiW_Pt_TiW, etc., with the underscore showing transition between layers. This stack can comprise different number of Ti/W pairs and can have different thicknesses. It is understood that in other embodiments this stack can comprise other materials in different layer combinations.

The interconnection metal layer can also comprise different materials for the electrical conductive layer, such as Ni, Au, Ag and Cu, either alone or combination. It is also understood that the layers in different embodiments can have different thicknesses. The following are different embodiments of interconnection metal layers using an adhesion/barrier stack, with the adhesion/barrier stack being the topmost layers of the interconnection metal layer:

Adhesion/Barrier Stack_4kAu_TiW
Adhesion/Barrier Stack_4kNi_TiW
Adhesion/Barrier Stack_4kPd_TiW The 4 k refers to a thickness of approximately 4000 angstroms for conductive material, although other thicknesses can also be used such as less than 3000 angstroms or greater than 5000 angstroms. The TiW layer also serves as a barrier layer against diffusion (conductive material out or other materials in) and also serves as a current conductor, although it is a less efficient conductor than the electrical conductive layer.

Other embodiments can also comprise interconnection metal layers with fewer or more layers, with some embodiments being provided without an adhesion/barrier stack. Instead, these embodiments can comprise only a conductive layer with barrier. One such embodiment can comprise Ni_TiW, with the Ni layer having different thicknesses such as approximately 4000 angstroms, although other thicknesses can also be used.

It is understood that other embodiments of interconnection metal layers can comprise different layers performing the same or similar functions as described above, but may not include an adhesion/barrier stack. These layers can comprise a layer of material with some embodiments using Ti, Pt or TiW of different thickness with different electrically conductive layers. Some embodiments of these layers can comprise Ti_Ni_TiW with the Ni layer having thicknesses in the range of 50-500 angstroms or more. It is understood that other interconnection metal layer embodiments can comprise many different layers arranged in different ways. For example, one embodiment can comprise TiPdNi_4kAu_TiW.

FIGS. 27 and 28 show the electrical path through the LED chip 600 during operation, with the electrical signal following a path through the emitter that is similar to the LED chip 350 shown in FIG. 21. In different embodiments the active regions 352 can be arranged in many different ways and as shown in FIG. 24, they can arranged in a linearly. In FIG. 28, the active regions 352 are arranged in a square with an electrical path 610 in FIGS. 27 and 28 showing current flowing between the active regions 352, with active regions 352 being serially connected such that the electrical signal conducts around the LED chip. This is only one of the ways that current can flow through LED chips according to the present invention. Although only two and four active regions 352 are shown in FIGS. 26 and 27, respectively, it is understood that LED chips according to the present invention can have many more active regions, and in those embodiments, the signal then passes on to the next of the active regions 352 connected in series and this continues until the last of the active regions 352. In different embodiments the active regions can be coupled together in different series and parallel interconnections.

During operation an electrical signal following a path through the active regions as shown by arrows 404, with the portion of the path between the active regions shown by path 610. In LED chip 600 the electrical signal is applied to the p-contact pad 382 and is conducted through the barrier layer 376, metal layer 368, and current spreading layer 364, to the p-type layer 358. The signal then passes through to the n-type layer 360 where it passes through to the n-contact 384 and the n-type vias 388. The signal then conducts along the interconnecting conductive layer 386 where it passes into the first of the p-type vias 398 and into the barrier layer for the next in line of the active regions 352. The steps above are generally repeated for each of the second through until the last of the active regions 352. At the last of the active regions the signal is conducted to the p-type layer 358 in the last active region 352, where it passes into the n-type layer 360, n-contact 384 and n-type vias 388. The signal is then conducted to the n-contact pad 400. As mentioned above, the third reflective layer 602 is electrically isolated from the other current carrying layers in the LED chip 600, but in other embodiments the reflective layer 602 can be in electrical contact with one or more layers and can be arranged to carry current during operation.

It is understood that other LED chip embodiments according to the present invention can be provided with different arrangements to address electromigration, with some of the embodiments not having separate reflective layers. These embodiments can have arrangements to maintain the reflectivity of the interconnection metal layer 386 while also minimizing electromigration. Referring now to FIG. 29, some embodiments can comprise an interconnection metal layer 386 comprising alternating layers of different materials with different properties. In some embodiments, the interconnect layer can comprise a first layer 620 that is an efficient electrical conductor but may be susceptible to electromigration. In some embodiments, the first layer 620 can also efficiently reflect LED chip light. A second layer 622 can be included that is less reflective but has higher resistance to electromigration than the first layer. In some embodiments, the second layers can have reflective properties so that the interconnection metal layer is reflects LED chip light.

The interconnection metal layer 386 can comprise alternating first and second layers 620, 622 that can alternately exhibit the properties of high reflectivity and resistance to electromigration. In different embodiments, there can be different numbers of these alternating layers with one embodiment comprising one or more conductive and highly reflective layers sandwiched between layers that are resistant to electromigration.

The multilayer arrangement can comprise any of the different materials described above including metals and dielectrics, or combinations thereof. Some embodiments can comprising at least a first layer that comprises a metal such as an Au for efficient electrical conductivity. This first layer can be sandwiched between layers to resist electromigration such as any of the materials discussed above, including Al, Ti, TiW and Pt. Different embodiments can have a plurality of alternating layers, with some embodiments having Al layers as the bottommost and topmost layers.

Still other conductive interconnect layer arrangements according to the present invention can be arranged differently to provide the desired reflectivity with resistance to electromigration. In some embodiments, the conductive interconnect layer 386 can comprise a high reflectivity material that includes an alloying materials to increase the resistance to electromigration. Many of the above materials can be used in the layer, with some embodiments comprising Al with various amounts of alloying materials such as copper, silicon, scandium or other possible alloying elements. The layer can be fabricated using known methods described above.

Although applicants do not wish to be bound by any one theory of how such alloyed layers function, it is believed that when certain reflective metal materials experience electromigration, the metal material typically migrates along grain boundaries of the surrounding material. It is also believed that the alloying materials tend to crowd the grain boundaries, and that sometimes relatively small amounts of alloying materials can be used. This crowding results in a "traffic jam" at the grain boundaries that effectively blocks some or all of the electromigration of the reflective metal. The alloying material can be included in the conductive interconnect layer in different concentrations, with some embodiments having alloying materials in the range of 1-20%. In still other embodiments the concentration of alloying materials can be in the range of 1-10%. In still other embodiments the concentration of alloying material can be approximately 1-5%.

It is understood that the embodiments according to the present invention can be used with many different LEDs or LED chips having different architecture and layer arrangements beyond those described above. The embodiments above are discussed with structures where the growth substrate can be removed as part of the fabrication process, with these embodiments having active structures mounted on a submount. The interconnecting layers are part of the LED chip and are primarily in the submount. In some of these embodiments dielectrics can be used for isolating the current flow on both sides of the chip.

The present invention can also be used in LED chip embodiments where the growth substrate is not removed, with some of these embodiments having a shaped or textured substrate to enhance light extraction. One embodiment of LED chip according to the present invention can comprise an architecture similar to those commercially available from Cree Inc., under its DA family of LED chips. The growth substrate can be made of different materials such as silicon carbide (SiC), sapphire, gallium nitride (GaN) or others. These types of chips are generally described in U.S. patent application Ser. No. 12/463,709 to Donofrio et al., entitled "Semiconductor Light Emitting Diodes Having Reflective Structures and Methods of Fabricating Same," which is incorporated herein by reference. The DA type chip is not fabricated on a submount. Instead, the active region or regions are on a growth substrate and the chip is flipped over for attachment to a component that has interconnect features. In some of these embodiments the active region can be between the interconnect element and the growth substrate. In some of these embodiments the growth substrate can be the primary emission surface and with the active region or regions between the substrate and component. Some of these structures can comprise entirely or partially oblique facets on one or more surfaces of the chip.

Another way to address the problem of dark areas around contact vias is through the use of a reflective layer, such as a self-aligned floating mirror layer. An example of a floating mirror layer that is self-aligned to a via is shown at the chip level in FIG. 30, which shows a front sectional view of an LED chip 700 comprising a semiconductor active region 702, a contact via 704, a reflective layer 706 (in this embodiment shown as a floating mirror layer), an additional mirror reflector layer 708, and an electrical connection material 710, a portion of which is in the contact via 704. As shown in FIG. 30, the floating mirror layer 706 can extend from the edge of the contact via 704 and therefore can eliminate or mitigate dark regions around the contact via 704 that would otherwise be present due to a spatial gap necessitated by a tolerance distance. As discussed above, such a tolerance distance between the is typically required to prevent shorting, for example, in devices with mirror layers carrying a current and/or is present due to manufacturing and device fabrication tolerances. It is understood that while the present disclosure describes mirror layers aligned with the edge of a via or substantially near the edge of a via, it is understood that in some embodiments, the mirror layers are proximate or adjacent to the via but are surrounded by an insulating material in the device in open space.

Various elements of the reflective layer 706 in FIG. 30, as well as its floating qualities and the quality of self-aligning to the contact via 704 present in some embodiments, are apparent through discussion of an example fabrication process. An example fabrication process simplified for ease of description and understanding for forming a self-aligned floating mirror layer with a contact via is shown in FIGS. 31-35. FIG. 31 shows the first step of the process, showing a portion of an LED chip 800 in which a contact via is to be formed. The LED chip 800 comprises a semiconductor layer 802. In the first step of the fabrication process, the portion of the LED chip 800 in which the via is to be formed is prepared for a fabrication process by multiple additional layers being deposited on the semiconductor layer 802. Any suitable fabrication process that allows for the removal of the various layers can be used with this method, for example, etching, cutting, machining, sawing, grinding, dicing or drilling. In the embodiment shown, an etching process is utilized.

First, a first insulating layer 804 is deposited on the semiconductor layer 802. Second, a mirror layer 806 is deposited on the first insulating layer. Third, a second insulating layer 808 can be deposited on the mirror layer 806. Accordingly, the mirror layer 806 can be positioned between the first insulating layer 804 and the second insulating layer 808. Fourth, a photoresist mask 810 can be deposited on the second insulating layer and is configured to define the area for the formation of the electrical via.

The semiconductor layer 802 corresponds to a device active region of the LED chip 800, and as mentioned above, can comprise two oppositely doped layers, for example, an n-type layer and a p-type layer, with an active region therebetween. Also as discussed above, the semiconductor layer 802 can comprise many suitable semiconductor-based materials. In the embodiment shown, the semiconductor layer 802 comprises GaN. In the embodiment shown, a via can be formed through one of the oppositely doped layers to allow for electrical contacting of the other layer.

The first insulating layer 804 and the second insulating layer 808 can comprise the same material and/or thickness or can comprise difference materials and/or thicknesses. The insulating layers 804, 808 can comprise any suitable electrically insulating material, for example, any ceramic material or an oxide, such as silicon dioxide, or any of the materials discussed above in reference to the insulator layer 108 described herein. In the embodiment shown, the insulating layers comprise silicon nitride, with the first insulating layer 804 comprising 2500 Å thick silicon nitride layer and the second insulating layer 806 comprising 5000 Å thick silicon nitride layer.

The reflective layer 806 can comprise any suitable mirror material, for example, various reflective metallic materials, dielectric-based materials, multiple-layer materials, and/or any of the materials described herein for use in a reflective layer, including omni-directional reflectors (ODRs), and distributed Bragg reflectors (DBRs). In the embodiment of FIG. 31, the reflective layer 806 comprises aluminum. The reflective layer 806 can function as the primary mirror layer for the LED chip 800 or can be configured to be a secondary reflector in the device to provide additional reflection around the vias, where traditional mirror layers would be insufficient due to the tolerance issues as described above.

The photoresist mask 810 is deposited on the second insulating layer 808 and is configured to define an unmasked area 812 of the LED chip 800 in which the contact via will be formed. The use of photoresist materials for etching processes is known and is therefore only briefly described herein. Such materials can be easily applied, patterned and removed without negatively affecting underlying layers.

After the portion of the LED chip 800 in which the via is to be formed is prepared for etching in the first step of the process shown in FIG. 31, the etching process can begin in the second step of the process shown in FIG. 32. FIG. 32 shows the LED chip 800 comprising the semiconductor layer 802, the first insulating layer 804, the mirror layer 806, the second insulating layer 808 and the photoresist mask 810. Etching of semiconductor and insulating materials is known in the art and only briefly described herein. Any suitable etch can be utilized, with the preferred process being an etching process that selectively removes the material that the second insulating layer 808 comprises without significantly affecting the underlying mirror layer 806. In the embodiment shown, a reactive ion etching process is utilized to remove the portion of the silicon nitride second insulating layer 808 that is in the unmasked area 812 of the LED chip 800, therefore exposing the mirror layer 806. In other embodiments, various chemical wet or dry etch processes are utilized.

After the portion of the second insulation layer 808 that was in the unmasked area 812 of the LED chip 800 has been etched away in the second step of the process as shown in FIG. 32, the mirror layer 806 can now be etched in a third step as is shown in FIG. 33. FIG. 33 shows the LED chip 800 comprising the semiconductor layer 802, the first insulating layer 804, the mirror layer 806, the second insulating layer 808 and the photoresist mask 810. In the third step of the process, the portion of the mirror layer exposed in the unmasked area 812 of the LED chip 800 is etched away, exposing the underlying first insulating layer 804.

The etching process used for this third step of etching the mirror layer 806 can be the same process as used for the second step of etching the second insulating layer 808 or can be a different etching process. The preferred etching process would be an etching process that selectively etches the material that the mirror layer 806 comprises, while not significantly affecting the underlying first insulating layer. In the embodiment shown, a chemical etching process which is slower than the process utilized to etch the second insulating layer 808 is utilized to remove the portion of the mirror layer 806 that is in the unmasked area 812 of the LED chip 800, therefore exposing the first insulating layer 804.

After the portion of the mirror layer 808 that was in the unmasked area 812 of the LED chip 800 has been etched away in the third step of the process as shown in FIG. 33, the first insulating layer can now be etched in a fourth step as is shown in FIG. 34. FIG. 34 shows the LED chip 800 comprising the semiconductor layer 802, the first insulating layer 804, the mirror layer 806, the second insulating layer 808 and the photoresist mask 810. In the fourth step of the process, the portion of the first insulating layer 804 that is exposed in the unmasked area 812 of the LED chip 800 is etched away, exposing the underlying semiconductor layer 802.

The etching process used for this fourth step of etching the first insulating layer 804 can be the same process as used for the second step of etching the second insulating layer 808 (as is the case in the embodiment shown) or can be a different etching process. The preferred etching process would be an etching process that selectively etches the material that the first insulating layer 804 comprises, while not significantly affecting the underlying semiconductor layer 802. This fourth step creates a via 850 to a portion of the semiconductor layer 802. The semiconductor layer 802 can be further etched, for example, using a different etching process that selectively etches the material that the semiconductor layer 802 comprises, to facilitate access to a particular portion of the semiconductor layer 802, for example, a particular doped layer, such as the n-doped or p-doped layer.

After the portion of the first oxide layer that was in the unmasked area 812 of the LED chip 800 has been etched away in the fourth step of the process in FIG. 34, an electrical contact 854 can be deposited in the via 850 as shown in FIG. 35. FIG. 35 shows the LED chip 800 comprising the semiconductor layer 802, the first insulating layer 804, the mirror layer 806, the second insulating layer 808 and the photoresist mask 810. In the fifth step of the process, an electrical contact 854 is deposited in the via 850 to make contact to the semiconductor layer 802.

As shown in FT. 35 this process of creating a contact via results in a mirror layer 806 extending from a position substantially near the edge of the via 850 and therefore substantially near the edge of the contact 854 deposited in the via. In some embodiments, the mirror layer 806 extends directly from an edge of the via 850 itself and can physically touch the contact 854. In some embodiments, the mirror layer 806 substantially surrounds or completely surrounds the via 850. In some embodiments the mirror layer 806 is substantially near an edge of the via 850. In some embodiments, the mirror layer 806 physically and/or electrically contacts the contact and/or conductive material within the contact via. In some embodiments, at least one additional layer is between the mirror layer 806 and the via 850 and/or conductive material within the via 850. Such additional layers include, for example, an additional device layer and/or dielectric layer. Also, as shown in FIG. 35, the mirror layer 806 is a floating mirror layer and is electrically isolated by the first and second insulating layers 804, 808. Accordingly, the mirror layer 806 can extend completely to the edge of the via 850 without causing an electrical short.

By utilizing a blanketed area of deposition for the mirror layer 806 and forming the contact via through the mirror layer 806 itself, rather than aligning the mirror layer 806 with a pre-designated via, the pattern of the mirror layer 806 is substantially aligned with the pattern of the via. Furthermore, as the mirror layer is floating and electrically isolated from any underlying interconnect layers of the device, device malfunction due to shorts caused by a mirror layer interacting with other features such as interconnect layers are eliminated.

It is understood that while an etching process is described herein, and is a convenient method for forming a self-aligned floating mirror layer and contact via, any process that can etch away, drill through, machine away, laser away or otherwise remove layers is within the scope of the present disclosure, provided the process is precise enough to perform the steps described above with reference to FIGS. 31-35.

The self-aligned floating mirror layers incorporating features of the present invention can be utilized with LED chips and devices comprising other integrated features described herein, for example, those described herein in reference to FIGS. 27 and 28. FIG. 36 shows an LED chip 900, similar to the LED chip 600 in FIG. 27, but further incorporating a self-aligned floating mirror layer 902 that extends from a position substantially near the conductive n-type layer vias 388.

Like the LED chip 600 in FIG. 27, the LED chip 900 in FIG. 36 comprises active regions 352, each of which comprises a p-type layer 358, an n-type layer 360, and an active layer 362 therebetween, and which are separated by streets 604. Also like the LED chip 600 in FIG. 27, the LED chip 900 in FIG. 36 further comprises a p-contact pad 382, a barrier layer 376, a first reflective layer 366, a second reflective layer 368, a current spreading layer 364, an n-type contact 384, conductive n-type layer vias 388, an electrical path 610, p-type vias 398, interconnect layers 386, an insulation layer 396, an n-contact pad 400, an n-pad via 402, and a third reflective layer 602.

Like in embodiment shown in FIG. 27, the embodiment shown in FIG. 36 shows an electrical signal following a path through the emitter 900 as shown by arrows 404. An electrical signal is applied to the p-contact pad 382 and is conducted through the barrier layer 376, second reflective layer 368, and current spreading layer 364, to the p-type layer 358. The signal then passes through to the n-type layer 360 where it passes through to the n-contact 384 and the n-type vias 388. The signal then conducts along the interconnection metal layer where it passes into the first of the p-type vias 398. The signal is then conducted to the p-type layer 358 in the second active region 352, where it passes into the n-type layer 360, n-contact 384 and n-type vias 388. Although only two active regions 352 are shown, it is understood that emitters according to the present invention can have many more, and in those embodiments, the signal then passes on to the next of the active regions 352 connected in series and this continues until the last of the active regions 352. At the last of the active regions 352, the electrical signal at the n-type vias 388 passes into the interconnection metal layer 386 and to the n-pad vias 402, where it is conducted to the n-contact pad 400. This type of interconnection and current flow allows for a high voltage LED chip light source formed monolithically on a submount.

While in the embodiment shown in FIG. 36, the top semiconductor layer is depicted as the n-doped layer and the bottom semiconductor layer is depicted as the p-doped layer, it is understood that in some embodiments, the p-doped layer is the topmost semiconductor layer and the n-doped layer is the bottommost semiconductor layer. It is also understood that while the self-aligned floating mirror layer is shown near the edge of the n-type vias, in some embodiments, the self-aligned floating mirror layer can be substantially near p-type vias.

As shown in FIG. 36, the mirror layer 902 is floating. It is not utilized to carry the current 402 such as other reflective layers are, for example, the second reflective layer 368, and therefore can contact the edges of the n-type vias 388 and the interconnect material therein without causing a short. The self-aligned floating mirror layer 902 can be at least partially within the insulation layer 808, and in some embodiments, the self-aligned floating mirror layer 902 can be substantially surrounded by the insulation layer 808. In some embodiments, the self-aligned floating mirror layer 902 is surrounded by the insulation layer 808 except for a portion of the self-aligned floating mirror layer 902 that contacts the edge of the n-type layer vias 388. In some embodiments, the self-aligned floating mirror layer 902 can be completely surrounded by the insulation layer 808.

Although the present invention has been described in detail with reference to certain preferred configurations thereof, other versions are possible. Embodiments of the present invention can comprise any combination of compatible features shown in the various figures, and these embodiments should not be limited to those expressly illustrated and discussed. Therefore, the spirit and scope of the invention should not be limited to the versions described above.

The foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A light emitting diode (LED), comprising:
   a first active region comprising two oppositely doped layers and an active layer therebetween;
   at least one contact via providing a path for electrical connection to one of said oppositely doped layers;
   a reflective layer extending from a position substantially near an edge of said at least one contact via, said reflective layer distinct from said at least one contact via; and
   an insulation layer substantially surrounding said reflective layer.

2. The LED of claim 1, wherein said reflective layer surrounds said at least one contact via.

3. The LED of claim 1, wherein said reflective layer is in contact with said at least one contact via at a first side of said reflective layer and said reflective layer is surrounded by said insulation layer on all other sides.

4. The LED of claim 1, wherein at least one additional layer is between said reflective layer and said at least one contact via.

5. The LED of claim 1, further comprising at least one additional active region physically separated from said first active region.

6. The LED of claim 5, further comprising at least one interconnect layer connecting one of said doped layers of said first active region with an oppositely doped layer of said at least one additional active region.

7. The LED of claim 6, wherein said LED chip comprises at least four active regions physically separated from one another and electrically connected by said at least one interconnect layer to produce a 12 volt LED device.

8. The LED of claim 7, wherein said at least four active regions are electrically connected in series.

9. The LED of claim 1, wherein said at least one contact via comprises a contact comprising a material that is resistant to electromigration.

10. The LED of claim 9, wherein said contact comprises a material selected from the group consisting of titanium, platinum, nickel and tungsten.

11. The LED of claim 1, further comprising at least one additional reflector layer.

12. A light emitting diode (LED), comprising:
a plurality of active regions physically separated from one another, each active region comprising two oppositely doped layers and an active layer therebetween;
at least one interconnect layer connecting one of said doped layers of one active region with an oppositely doped layer of another active region, wherein at least a portion of said at least one interconnect layer is in a contact via providing a path for electrical connection to one of said active regions in said plurality;
a reflective layer extending from a position substantially near an edge of said contact via, said reflective layer distinct from said interconnect layer; and
an insulation layer substantially surrounding said reflective layer.

13. The LED of claim 12, wherein said reflective layer surrounds said at least one contact via.

14. The LED of claim 12, wherein said reflective layer is in contact with said interconnect layer at a first side of said reflective layer and said reflective layer is surrounded by said insulation layer on all other sides.

15. The LED of claim 14, wherein said at least one interconnect layer comprises a material selected from the group consisting of titanium, platinum, nickel and tungsten.

16. The LED of claim 11, wherein said plurality of active regions is electrically connected in series.

* * * * *